United States Patent
Hiroki

(10) Patent No.: US 10,502,508 B2
(45) Date of Patent: Dec. 10, 2019

(54) SYSTEM INCLUDING TEMPERATURE-CONTROLLABLE STAGE, SEMICONDUCTOR MANUFACTURING EQUIPMENT AND STAGE TEMPERATURE CONTROL METHOD

(71) Applicant: TOKYO ELECTRON LIMITED, Tokyo (JP)

(72) Inventor: Tsutomu Hiroki, Nirakaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 377 days.

(21) Appl. No.: 14/751,179

(22) Filed: Jun. 26, 2015

(65) Prior Publication Data

US 2015/0377571 A1 Dec. 31, 2015

(30) Foreign Application Priority Data

Jun. 27, 2014 (JP) ................................ 2014-132224

(51) Int. Cl.
*F28F 27/02* (2006.01)
*F28F 13/06* (2006.01)
(Continued)

(52) U.S. Cl.
CPC .............. *F28F 27/02* (2013.01); *F28F 13/06* (2013.01); *H01J 37/32724* (2013.01);
(Continued)

(58) Field of Classification Search
CPC ........ F28F 27/02; F28F 13/06; F28F 2250/00; F28F 2250/08; F28F 2250/10;
(Continued)

(56) References Cited

U.S. PATENT DOCUMENTS 5,085,750 A * 2/1992 Soraoka ............ H01L 21/67069
118/723 R
5,265,670 A 11/1993 Zingher
(Continued)

FOREIGN PATENT DOCUMENTS

CN 1841654 A 10/2006
JP 5-136095 A 6/1993
(Continued)

OTHER PUBLICATIONS

English Machine Translation JP-10284382-A, dated Oct. 1998, Kitahashi et al.*
King, Andrew J C. Chandratilleke, Tilak T., Heat Transfer Enhancement Due to Cavities in Impinging Jets, Research Publishing Services, 20th National and 9th International ISHMT-ASME Heat and Mass Transfer Conference (Year: 2010).*

*Primary Examiner* — Rakesh K Dhingra
*Assistant Examiner* — Laureen Chan
(74) *Attorney, Agent, or Firm* — Nath, Goldberg & Meyer; Jerald L. Meyer

(57) ABSTRACT

There is provided a system including a temperature-controllable stage, which includes: a disc-shaped plate having a front surface on which a substrate is mounted and a rear surface; a heat exchanger configured to individually supply a heat exchange medium to a plurality of regions two-dimensionally arranged to face the rear surface of the plate and configured to individually recover the heat exchange medium supplied to the regions, the plurality of regions being obtained by dividing a plurality of zones defined to face the rear surface of the plate in the heat exchanger; and a plurality of valve units configured to control, for each of the plurality of zones, the supply or cutoff of the heat exchange medium to the plurality of regions by the heat exchanger.

15 Claims, 16 Drawing Sheets

(51) Int. Cl.
  *H01L 21/67* (2006.01)
  *H01J 37/32* (2006.01)
  *H01L 21/687* (2006.01)
(52) U.S. Cl.
  CPC .. *H01L 21/67103* (2013.01); *H01L 21/67109* (2013.01); *H01L 21/68785* (2013.01)
(58) Field of Classification Search
  CPC ...... F28F 3/005; F28F 3/08; F28F 3/14; F28F 3/12; H01L 21/67109; H01L 21/67103; H01L 21/68785; H01L 23/40; H01L 23/46; H01L 23/473; H01L 23/4735; H01L 23/476; H01L 23/427; H01J 37/32724; H01J 2237/2001; H01J 37/32715; C23C 14/51; C23C 14/541; C23C 16/48; C23C 16/50; C23C 16/46; C23C 16/463; C23C 16/466; F28D 2021/0028; F28D 2021/0029; F28D 15/02; F28D 20/0034; F28D 15/0266; F28D 15/06; F28D 7/00; F28D 9/00; F28D 9/0081; F24F 1/01; F24F 13/26; F24F 3/005; F24F 3/08
  See application file for complete search history.

(56) References Cited

U.S. PATENT DOCUMENTS

| | | | |
|---|---|---|---|
| 2012/0132397 A1* | 5/2012 | Silveira | H01J 37/20 165/104.13 |
| 2012/0247954 A1* | 10/2012 | Yamawaku | H01J 37/32091 204/298.31 |
| 2013/0276981 A1* | 10/2013 | Silveira | H01L 21/67109 156/345.29 |

FOREIGN PATENT DOCUMENTS

| | | | | |
|---|---|---|---|---|
| JP | 7-321188 A | | 12/1995 | |
| JP | 8-45909 A | | 2/1996 | |
| JP | 08045909 A | * | 2/1996 | |
| JP | 10284382 A | * | 10/1998 | ......... G03F 7/70875 |
| JP | 2005-268720 A | | 9/2005 | |
| JP | 2006-286733 A | | 10/2006 | |
| JP | 2009-218420 A | | 9/2009 | |
| JP | 2011-178300 A | | 9/2011 | |
| JP | 2013-42127 A | | 2/2013 | |
| JP | 2013-105359 A | | 5/2013 | |
| JP | 2014-021828 A | | 2/2014 | |

* cited by examiner

SYSTEM INCLUDING TEMPERATURE-CONTROLLABLE STAGE, SEMICONDUCTOR MANUFACTURING EQUIPMENT AND STAGE TEMPERATURE CONTROL METHOD

CROSS-REFERENCE TO RELATED APPLICATION

This application claims the benefit of Japanese Patent Application No. 2014-132224, filed on Jun. 27, 2014, in the Japan Patent Office, the disclosure of which is incorporated herein in its entirety by reference.

TECHNICAL FIELD

The present disclosure relates to a system including a temperature-controllable stage, a semiconductor manufacturing equipment and a stage temperature control method.

BACKGROUND

When manufacturing an electronic device, a plasma processing such as a plasma etching or the like is performed with respect to a workpiece. In this plasma processing, in-plane uniformity is required in processing the workpiece. In order to realize the in-plane uniformity of the processing, it is required to accurately control a temperature distribution of the workpiece.

A system which adjusts a temperature of a mounting stand to control the temperature distribution of the workpiece has been used. For example, a system in which a temperature of an electrostatic chuck of a mounting stand is controlled by supplying a high-temperature fluid and a low-temperature fluid to a temperature adjusting unit is available. The temperature adjusting unit is formed within the mounting stand to extend along a circumferential direction of the mounting stand. Such a system includes a bypass flow path, a low-temperature flow path and a high-temperature flow path. The bypass flow path is connected to an inlet and an outlet of the temperature adjusting unit and circulates a fluid between the inlet and the outlet. The low-temperature flow path is connected to the bypass flow path and supplies a low-temperature fluid provided from a low-temperature-side temperature adjusting unit to the bypass flow path. The high-temperature flow path is connected to the bypass flow path and supplies a high-temperature fluid provided from a high-temperature-side temperature adjusting unit to the bypass flow path. Valves whose valve opening degrees are changed in conjunction with each other are respectively connected to the bypass flow path, the low-temperature flow path and the high-temperature flow path.

Furthermore, there is available a temperature control device which includes a mounting stand, a chiller unit, a heating unit, a flow path switching unit, a controller, and so forth. In the mounting stand, there are formed a first coolant path which extends along a circumferential direction of the mounting stand in the central region of the mounting stand and a second coolant path which extends along the circumferential direction of the mounting stand in a peripheral region of the mounting stand. By operating the heating unit and switching an opening/closing of an on-off valve of the flow path switching unit under the control of the controller, the temperature control unit individually controls temperatures of coolants flowing through the first coolant path and the second coolant path of the mounting stand through the use of a single chiller unit.

In the device (or the system) mentioned above, a flow path which allows a heat exchange medium to flow therethrough is formed along the circumferential direction of the mounting stand. In this device, the heat exchange medium receives heat from a substrate during the course of flowing through the flow path. This causes a difference in temperature of the heat exchange medium flowing through the flow path, depending on positions in the circumferential route. As a result, a difference is generated in a temperature distribution of the mounting stand, which makes it difficult to accurately control the temperature of the mounting stand.

SUMMARY

Some embodiments of the present disclosure provide a system capable of accurately controlling a temperature of a mounting stand, a semiconductor manufacturing equipment and a stage temperature control method.

According to one embodiment of the present disclosure, there is provided a system including a temperature-controllable stage, which includes: a disc-shaped plate having a front surface on which a substrate is mounted and a rear surface; a heat exchanger configured to individually supply a heat exchange medium to a plurality of regions two-dimensionally arranged to face the rear surface of the plate and configured to individually recover the heat exchange medium supplied to the regions, the plurality of regions being obtained by dividing a plurality of zones defined to face the rear surface of the plate in the heat exchanger; and a plurality of valve units configured to control, for each of the plurality of zones, the supply or cutoff of the heat exchange medium to the plurality of regions by the heat exchanger.

According to another embodiment of the present disclosure, there is provided a semiconductor manufacturing equipment provided with the aforementioned system.

According to another embodiment of the present disclosure, there is provided a method of controlling a temperature of a stage which includes a plate having a front surface on which a substrate is supported and a rear surface. The method includes: a first process of controlling a temperature of a first zone among a plurality of zones defined to face the rear surface of the plate, the first processing including; circulating a heat exchange medium adjusted to a first temperature between a first heat exchange medium supply device and the first zone; circulating the heat exchange medium adjusted to a second temperature higher than the first temperature between a second heat exchange medium supply device and the first zone; and circulating the heat exchange medium between the first zone and a first pump without returning the heat exchange medium to the first heat exchange medium supply device and the second heat exchange medium supply device; and a second process of controlling a temperature of a second zone among the plurality of zones, the second process including: circulating the heat exchange medium adjusted to the first temperature between the first heat exchange medium supply device and the second zone; circulating the heat exchange medium adjusted to the second temperature between the second heat exchange medium supply device and the second zone; and circulating the heat exchange medium between the second zone and a second pump without returning the heat exchange medium to the first heat exchange medium supply device and the second heat exchange medium supply device.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the respective drawings, identical or equivalent parts will be designated by like reference symbols. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, a description will be made on a plasma processing apparatus provided with a system according to one embodiment. A stage ST, a valve unit group VU, a first heat exchange medium supply device 100a and a second heat exchange medium supply device 100b constitute the system which includes a temperature-controllable stage according to one embodiment.

Figure 1:
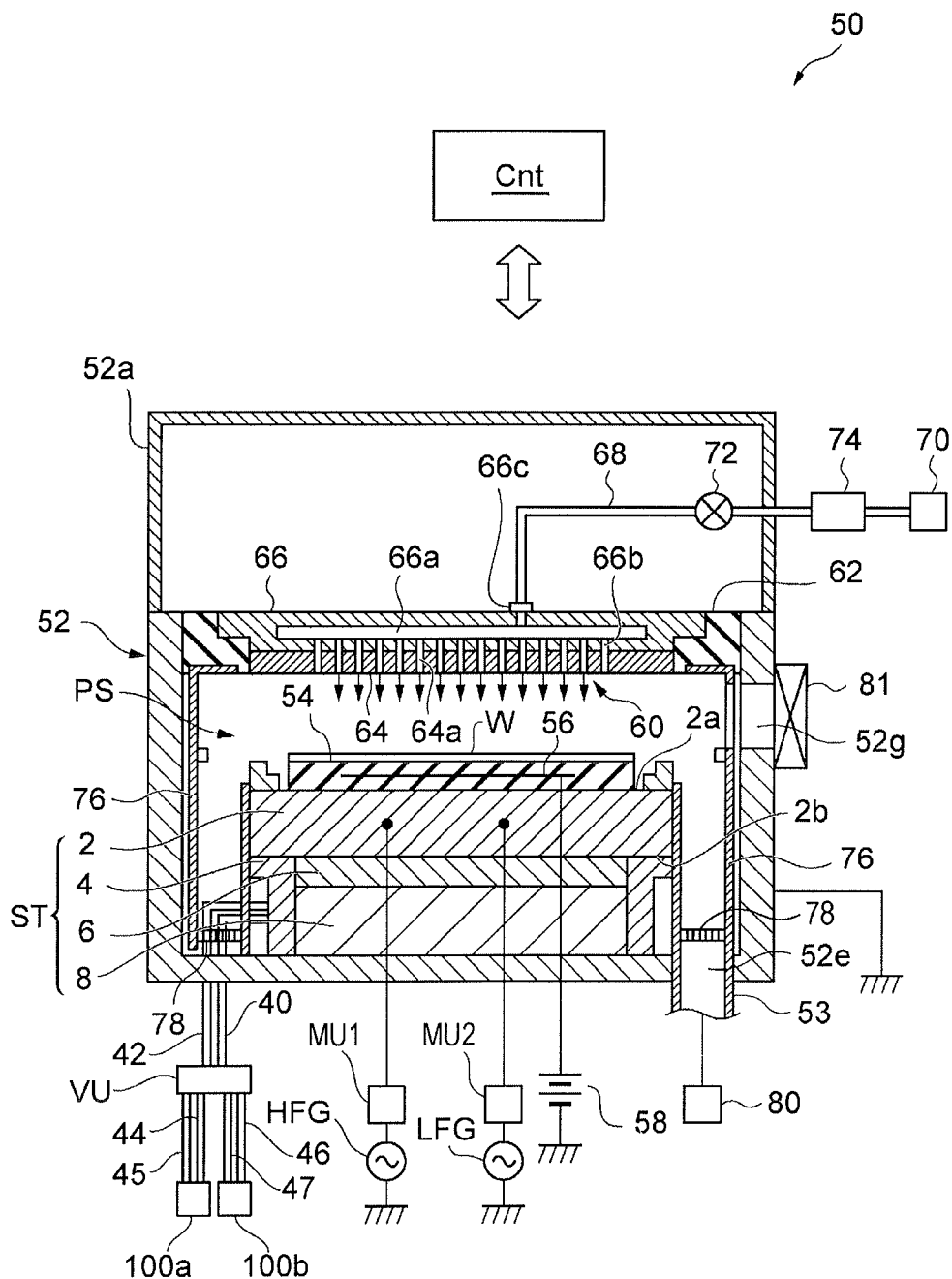
FIG. 1 is a sectional view schematically showing a plasma processing apparatus according to one embodiment.

FIG. 1 is a sectional view schematically showing a plasma processing apparatus 50 according to one embodiment. The plasma processing apparatus 50 used as a capacitively-coupled parallel-plate-type plasma etching apparatus includes a substantially cylindrical processing vessel 52. The processing vessel 52 is made of, e.g., aluminum whose surface is anodized. The processing vessel 52 is grounded.

Figure 2:
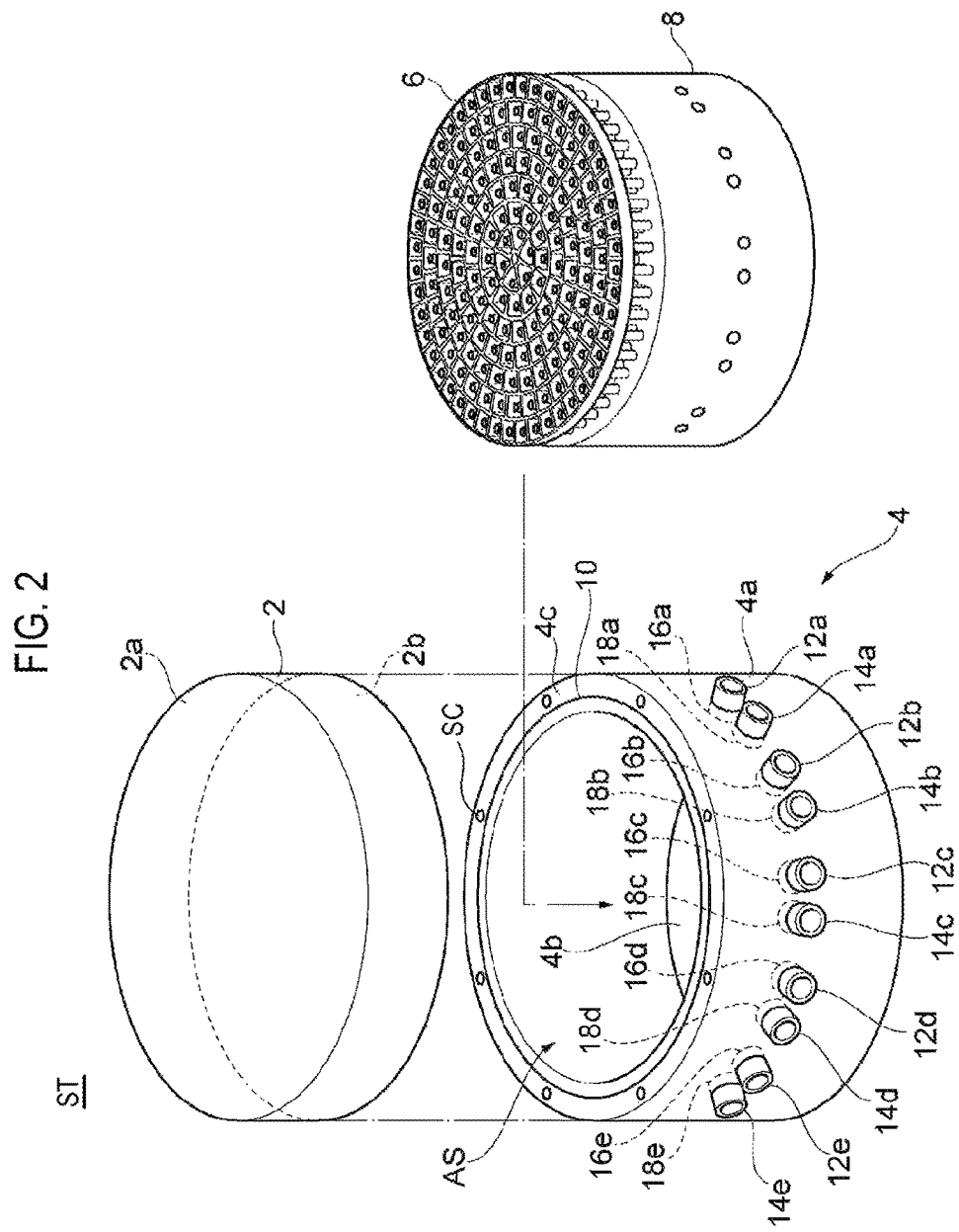
FIG. 2 is an exploded perspective view of a stage according to one embodiment.

The stage ST is disposed on a bottom portion of the processing vessel 52. As shown in FIG. 1, the stage ST includes a plate 2, a case 4, a heat exchanger 6 and a flow path part 8. Referring to FIG. 2, the stage ST will be described in detail. FIG. 2 is an exploded perspective view of the stage ST. The stage ST shown in FIG. 2 is used as a mounting stand for supporting a substrate W within the processing vessel 52.

The plate 2 has a disc shape and is made of, e.g., metal such as aluminum or the like. The plate 2 includes a front surface 2a and a rear surface 2b. The substrate W can be mounted on the front surface 2a of the plate 2.

The case 4 is made of, e.g., metal such as stainless steel or the like and includes a sidewall 4a and a bottom wall 4b. The sidewall 4a has a cylindrical shape and defines an accommodating space AS therein. The sidewall 4a extends in a direction of a cylinder axis and supports the plate 2 from below. The bottom wall 4b is connected to a lower end portion of the sidewall 4a. In an upper end surface 4c of the sidewall 4a, there may be installed an O-ring 10 which annularly extends along the upper end surface 4c. The plate 2 is air-tightly fixed to the upper end surface 4c through the O-ring 10 by, e.g., screws SC. Thus, the accommodating space AS is defined in the stage ST. In the sidewall 4a, there are installed a plurality of supply pipes 12a, 12b, 12c, 12d and 12e and a plurality of recovery pipes 14a, 14b, 14c, 14d and 14e. The supply pipes 12a, 12b, 12c, 12d and 12e extend along a radial direction of the sidewall 4a and communicate with the accommodating space AS through first openings 16a, 16b, 16c, 16d and 16e (hereinafter simply referred to as "first openings 16" if there is no need to distinguish them from one another), respectively. The recovery pipes 14a, 14b, 14c, 14d and 14e extend along the radial direction of the sidewall 4a and communicate with the accommodating space AS through second openings 18a, 18b, 18c, 18d and 18e (hereinafter simply referred to as "second openings 18" if there is no need to distinguish them from one another), respectively.

Figure 3:
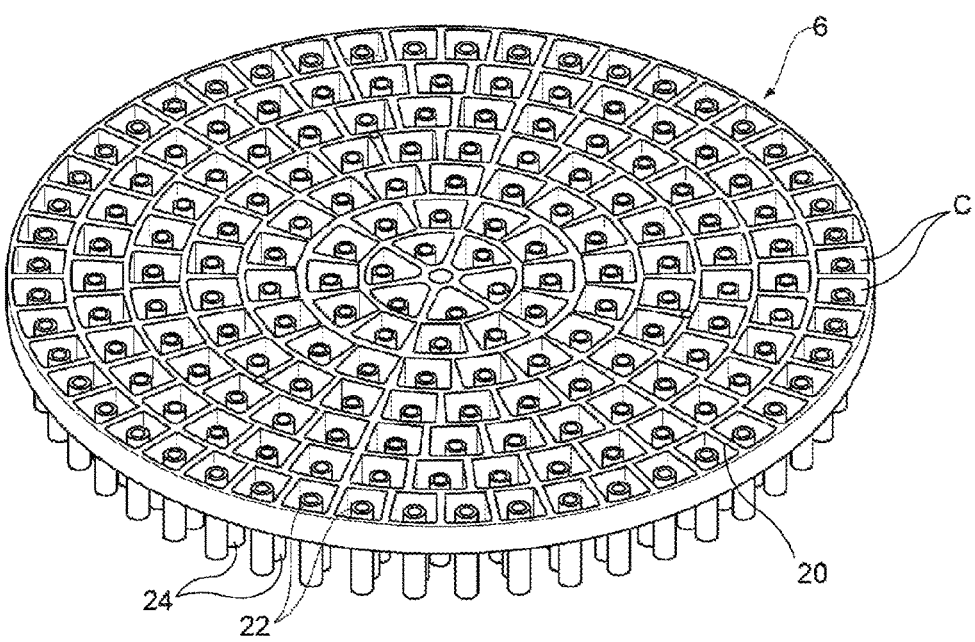
FIG. 3 is a perspective view of a heat exchanger according to one embodiment.
Figure 4A:
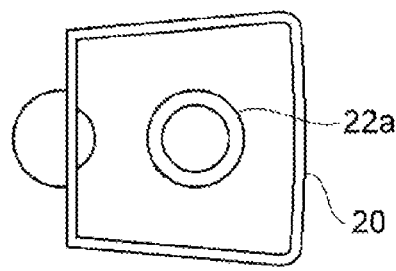
FIG. 4A is a plan view of one of the cell parts.
Figure 4B:
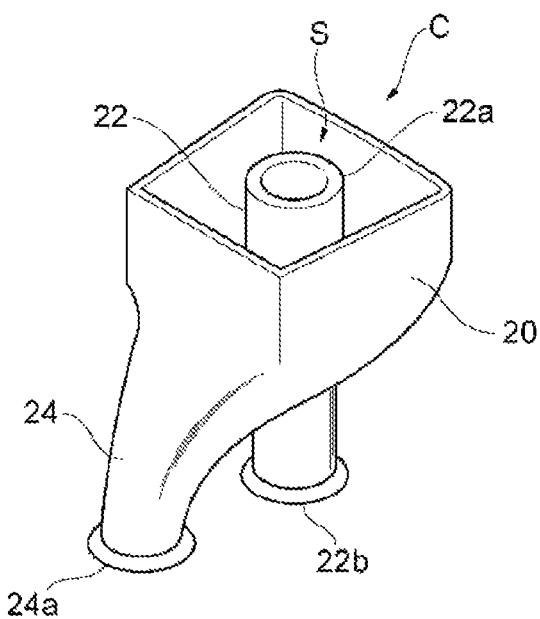
FIG. 4B is a top perspective view of one of the cell parts.
Figure 4C:
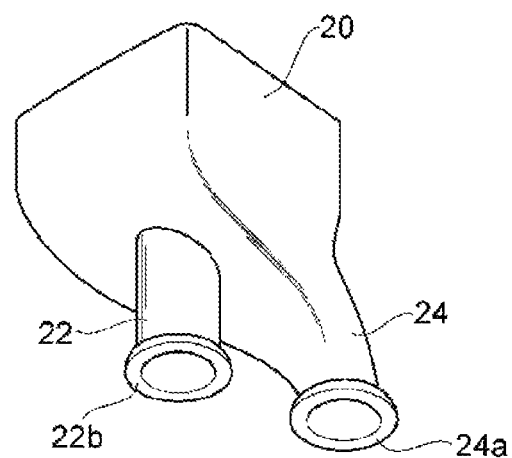
FIG. 4C is a bottom perspective view of one of the cell parts.
Figure 5:
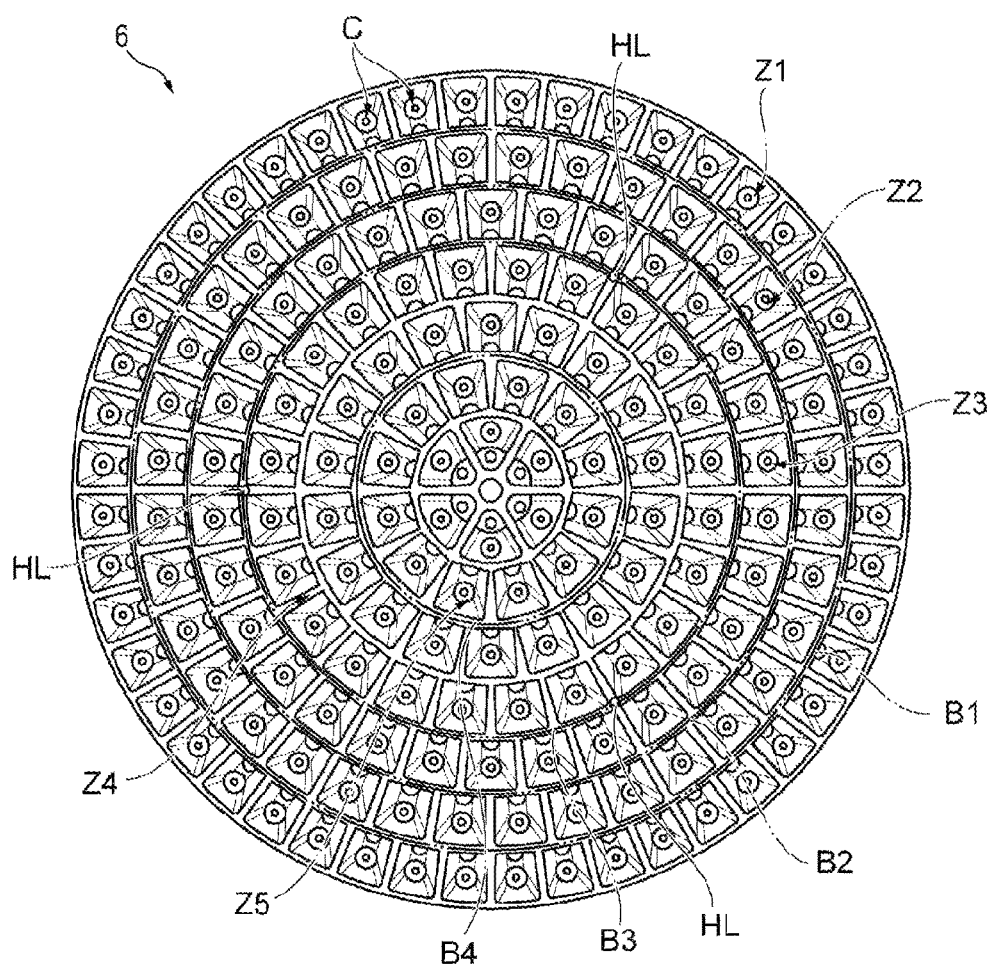
FIG. 5 is a plan view of a heat exchanger according to one embodiment.

The heat exchanger 6 and the flow path part 8 are accommodated within the accommodating space AS of the case 4. Referring to FIGS. 3 to 5, the heat exchanger 6 will be described in detail. FIG. 3 is a perspective view of the heat exchanger 6. As shown in FIG. 3, the heat exchanger 6 includes a plurality of partition walls 20, a plurality of first pipes 22 and a plurality of second pipes 24. The heat exchanger 6 is configured to individually supply a heat exchange medium to a plurality of regions two-dimensionally arranged in the rear surface 2b of the plate 2. The plurality of regions is defined by circumferentially dividing a plurality of zones bounded by a plurality of concentric circles on the rear surface 2b of the plate 2. The heat exchanger 6 is configured to individually recover the supplied heat exchange medium.

Each of the partition walls 20 as a whole is formed in a disc shape or a cylindrical columnar shape. The partition walls 20 include a plurality of cell parts C which is formed along the center axis of the partition wall 20. The cell parts C are two-dimensionally arranged along radial and circumferential directions of the heat exchanger 6. Each of the cell parts C has a rectangular plane-view shape such that the width thereof grows larger toward the outer side of the heat exchanger 6 when seen from the top. Each of the cell parts C defines a space S having a substantially rectangular cross section. That is to say, the partition walls 20 include the respective spaces S which are two-dimensionally arranged and mutually non-inclusive regions below the plate 2. One of the cell parts C is shown in FIGS. 4A to 4C. FIG. 4A is a plan view of the cell part C, FIG. 4B is a top perspective view of the cell part C, and FIG. 4C is a bottom perspective view of the cell part C. In some embodiments, the cell parts C may be coupled to one another so as to form a honeycomb structure when seen from the top.

The first pipes 22 are installed to extend through substantially central positions of the spaces S, respectively. The first pipes 22 extend toward the rear surface 2b (see FIG. 2) of the plate 2 in a mutually parallel relationship. Each of the first pipes 22 is surrounded by the partition wall 20 which defines the peripheral space thereof. Each of the first pipes 22 includes a first opened end 22a and a second opened end 22b. The first opened end 22a is disposed to face the rear surface 2b of the plate 2. The second opened end 22b is positioned at the opposite side of the first opened end 22a and is located below the space S. Each of the first pipes 22 serves as a pipe which receives a heat exchange medium from the first heat exchange medium supply device 100a or the second heat exchange medium supply device 100b (which will be described later) and ejects the heat exchange medium through the first opened end 22a.

The second pipes 24 are connected to the partition walls 20 so as to communicate with the spaces S, respectively. An opening 24a is formed in a lower end portion of each of the second pipes 24. The second pipes 24 serve as pipes which outwardly discharge the heat exchange medium ejected from the first opened ends 22a of the first pipes 22 and recovered into the spaces S surrounding the first pipes 22, respectively. In the heat exchanger 6 configured as above, the first pipes 22, the partition walls 20 defining the spaces S surrounding the first pipes 22, and the second pipes 24 communicating with the spaces S, constitute heat exchange units, respectively. Accordingly, the heat exchanger 6 includes a plurality of heat exchange units which is two-dimensionally arranged in a mutually non-inclusive manner.

In one embodiment, the heat exchanger 6 may be made of a material mainly composed of resin, ceramic or metal. In order to suppress influence between the heat exchange units arranged adjacent to each other, the heat exchanger 6 may be made of a material having low heat conductivity, e.g., ceramic or resin, and especially, resin. In some embodiments, the material of which the heat exchanger 6 is made may be partially changed in order to change a strength or a heat conductivity of the heat exchanger 6. As an example, the first opened ends 22a of the first pipes 22 may be made of resin which contains carbon, ceramic powder, glass fibers, metal powder or the like. This makes it possible to locally increase the strength of the first opened ends 22a. In some embodiments, the heat exchanger 6 may be formed through the use of, e.g., a 3D printer.

FIG. 5 is a plan view of the heat exchanger 6. The heat exchanger 6 is divided into a plurality of zones Z1, Z2, Z3, Z4 and Z5 bounded by the plurality of concentric circles centered at the central axis of the heat exchanger 6. That is to say, the zones Z1, Z2, Z3, Z4 and Z5 are mutually partitioned by a plurality of concentric boundaries B1, B2, B3 and B4. The zone Z1 is an annular region centered at the central axis of the heat exchanger 6 and is positioned along an outer edge portion of the heat exchanger 6. The zones Z2, Z3 and Z4 are annular regions concentric with the zone Z1 and are respectively positioned inward of the zones Z1, Z2 and Z3. The zone Z5 is a circular region positioned inward of the zone Z4 and is located at the center of the heat exchanger 6. Within each of the zones Z1, Z2, Z3, Z4 and Z5, the respective cell parts C are arranged along the circumferential direction. In the boundary B3 of the heat exchanger 6, three holes HL penetrating vertically through the heat exchanger 6 are formed at regions surrounded by the four partition walls 20 of the four cell parts C in four directions. The holes HL are used as holes into which lift-up pins are inserted to lift up the substrate W from a mounting surface.

Figure 6:
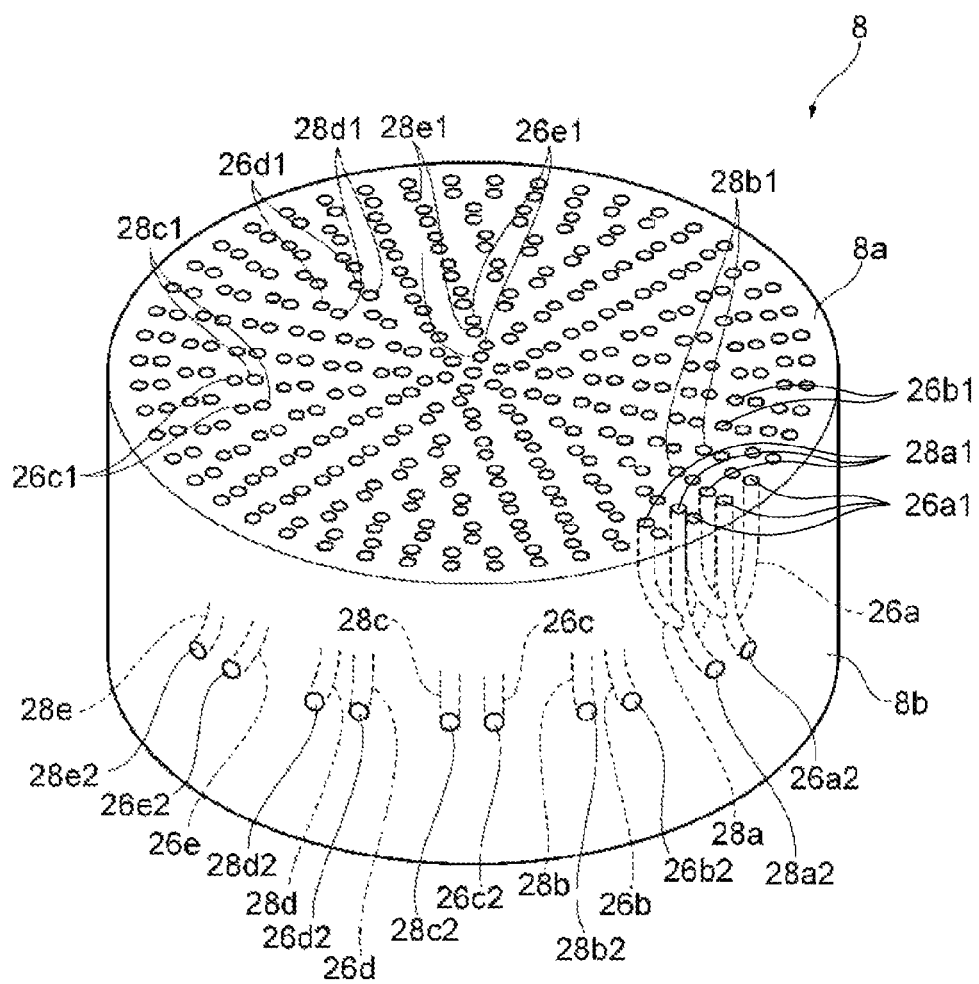
FIG. 6 is a perspective view of a flow path part.

Next, a description will be made on the flow path part 8. FIG. 6 is a perspective view of the flow path part 8. The flow path part 8 is disposed below the heat exchanger 6. The flow path part 8 provides flow paths through which the heat exchange medium is supplied to the heat exchanger 6 and through which the heat exchange medium is recovered from the heat exchanger 6.

As shown in FIG. 6, the flow path part 8 is a substantially circular columnar block and includes an upper surface 8a and a side surface 8b. In the flow path part 8, a plurality of supply flow paths 26a, 26b, 26c, 26d and 26e are formed (hereinafter simply referred to as "supply flow paths 26" if there is no need to distinguish them from one another) to penetrate through the flow path part 8, and a plurality of recovery flow paths 28a, 28b, 28c, 28d and 28e are formed (hereinafter simply referred to as "recovery flow paths 28" if there is no need to distinguish them from one another) to penetrate through the flow path part 8. In the flow path part 8, a plurality of small-diameter cavities are formed to penetrate through the side surface 8b of the flow path part 8 toward the upper surface 8a. These cavities constitute the supply flow paths 26 and the recovery flow paths 28.

The supply flow path 26a is branched at the intermediate position thereof and is provided with a plurality of (e.g., three) first end portions 26a1 and one second end portion 26a2. The first end portions 26a1 are respectively formed in the upper surface 8a of the flow path part 8 at positions corresponding to the first pipes 22 arranged within the zone Z1. The first end portions 26a1 are respectively connected to the second opened ends 22b of the first pipes 22 arranged within the zone Z1. The second end portion 26a2 is formed in the side surface 8b of the flow path part 8. The second end portion 26a2 is formed at a position corresponding to the first opening 16a of the case 4. When the flow path part 8 is accommodated within the case 4, the second end portion 26a2 is positioned to face the first opening 16a. The supply flow path 26a is used as a flow path for supplying the heat exchange medium introduced through the first opening 16a to the first pipes 22 arranged within the zone Z1 of the heat exchanger 6.

The recovery flow path 28a is branched at the intermediate position thereof and is provided with a plurality of (e.g., three) first end portions 28a1 and one second end portion 28a2. The plurality of first end portions 28a1 are formed on the upper surface 8a of the flow path part 8 at positions corresponding to the second pipes 24 arranged within the zone Z1. The first end portions 28a1 are respectively connected to the openings 24a of the second pipes 24 arranged within the zone Z1. The second end portion 28a2 is formed in the side surface 8b of the flow path part 8. The second end portion 28a2 is formed at a position corresponding to the second opening 18a of the case 4. When the flow path part 8 is accommodated within the case 4, the second end portion 28a2 is positioned to face the second opening 18a. The recovery flow path 28a is used as a flow path for discharging the heat exchange medium recovered from the heat exchanger 6 through the second pipes 24 arranged within the zone Z1 of the heat exchanger 6, to the outside of the stage ST through the second opening 18a.

Just like the supply flow path 26a, each of the supply flow paths 26b, 26c, 26d and 26e is provided with a plurality of first end portions 26b1, 26c1, 26d1 and 26e1 and one second end portion 26b2, 26c2, 26d2 and 26e2. The plurality of first end portions 26b1, 26c1, 26d1 and 26e1 are formed in the upper surface 8a of the flow path part 8 at positions corresponding to the first pipes 22 arranged within the zones Z2, Z3, Z4 and Z5, respectively. The first end portions 26b1, 26c1, 26d1 and 26e1 are respectively connected to the second opened ends 22b of the first pipes 22 arranged within the zones Z2, Z3, Z4 and Z5. The second end portion 26b2, 26c2, 26d2 and 26e2 are formed in the side surface 8b of the flow path part 8. The second end portion 26b2, 26c2, 26d2 and 26e2 are formed at positions corresponding to the first openings 16b, 16c, 16d and 16e of the case 4, respectively. When the flow path part 8 is accommodated within the case 4, the second end portion 26b2, 26c2, 26d2 and 26e2 are positioned to face the first openings 16b, 16c, 16d and 16e, respectively. The supply flow paths 26b, 26c, 26d and 26e are used as flow paths for supplying the heat exchange medium introduced through the first openings 16b, 16c, 16d and 16e to the first pipes 22 arranged within the zones Z2, Z3, Z4 and Z5 of the heat exchanger 6, respectively.

Just like the recovery flow path 28a, each of the recovery flow paths 28b, 28c, 28d and 28e is provided with a plurality of first end portions 28b1, 28c1, 28d1 and 28e1 and one second end portion 28b2, 28c2, 28d2 and 28e2, respectively. The first end portions 28b1, 28c1, 28d1 and 28e1 are formed in the upper surface 8a of the flow path part 8 at positions corresponding to the second pipes 24 arranged within the zones Z2, Z3, Z4 and Z5, respectively. The first end portions 28b1, 28c1, 28d1 and 28e1 are respectively connected to the openings 24a of the second pipes 24 arranged within the zones Z2, Z3, Z4 and Z5. The second end portions 28b2, 28c2, 28d2 and 28e2 are formed in the side surface 8b of the flow path part 8. The second end portion 28b2, 28c2, 28d2 and 28e2 are formed at positions corresponding to the second opening 18b, 18c, 18d and 18e of the case 4. When the flow path part 8 is accommodated within the case 4, the second end portions 28b2, 28c2, 28d2 and 28e2 are positioned to face the second openings 18b, 18c, 18d and 18e, respectively. The recovery flow paths 28b, 28c, 28d and 28e are used as flow paths for discharging the heat exchange medium recovered from the heat exchanger 6 through the second pipes 24 arranged in the zones Z2, Z3, Z4 and Z5 of the heat exchanger 6, to the outside of the stage ST through the second opening 18b, 18c, 18d and 18e, respectively.

The supply flow paths 26 and the recovery flow paths 28 are formed as independent flow paths which do not communicate with each other. In one embodiment, the supply flow paths 26 are equal in conductance to one another and the recovery flow paths 28 are equal in conductance to one another. The term "conductance" used herein is an index which indicates the ease of flow of a fluid and is a value decided depending on the diameter, length and curvature of a flow path. For example, the conductance of each of the supply flow paths 26 and the recovery flow paths 28 is made uniform by adjusting the diameter and the curvature of the flow paths along the length thereof. In one embodiment, for the purpose of suppressing the influence between the adjoining flow paths, the flow path part 8 may be made of a material having low heat conductivity, e.g., a material mainly composed of ceramic or resin. In some embodiments, resin may be used as the material. The flow path part 8 can be formed through the use of, e.g., a 3D printer. Particularly, when installing a multiplicity of, e.g., 100 to 1,000, flow paths, the use of the 3D printer makes it possible to three-dimensionally arrange the flow paths. This is effective in increasing the degree of freedom of design and in making uniform the conductance.

Referring back to FIG. 1, the plasma processing apparatus 50 will be further described. An electrostatic chuck 54 is installed on the front surface 2a of the plate 2 of the stage ST. The electrostatic chuck 54 has a structure in which an electrode 56 as a conductive film is disposed between a pair of insulation layers or insulation sheets. The electrode 56 is electrically connected to a DC power supply 58. The electrostatic chuck 54 can electrostatically suck and hold the substrate W by virtue of an electrostatic force such as a Coulomb force or the like generated by a DC voltage supplied from the DC power supply 58.

The plasma processing apparatus 50 further includes a valve unit group VU disposed outside the processing vessel 52. The valve unit group VU is configured to control the supply or cutoff of the heat exchange medium to the heat exchanger 6 on a zone-by-zone basis. The valve unit group VU includes valve units VU1, VU2, VU3, VU4 and VU5 (see FIG. 7). The term "heat exchange medium" used herein refers to a fluid flowing through the stage ST for the purpose of heat exchange with the plate 2 and denotes a concept which encompasses a cooling medium for absorbing heat from the plate 2 and a heating medium for applying heat to the plate 2. Examples of the heat exchange medium used as the cooling medium may include cooling water and fluorine-based liquid. The heat exchange medium is not limited to a liquid but may be a medium which performs a phase change cooling with a vaporization heat or a medium which performs a gas cooling with a gas.

Figure 7:
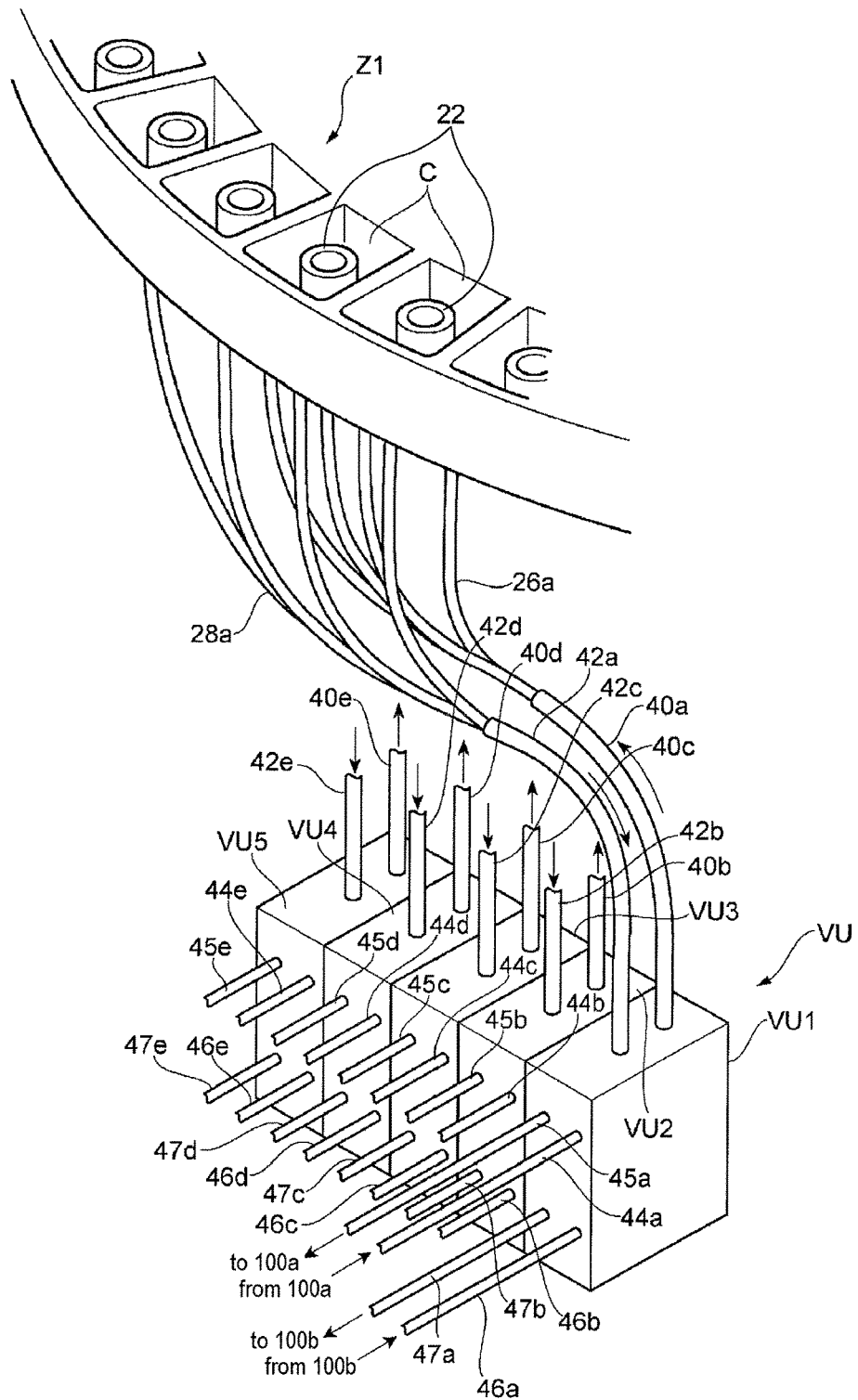
FIG. 7 is a perspective view of a valve unit group.

The valve unit group VU is coupled to a supply port of the first heat exchange medium supply device 100a through a low-temperature fluid supply path 44. Furthermore, the valve unit group VU is coupled to a recovery port of the first heat exchange medium supply device 100a through a low-temperature fluid recovery path 45. The low-temperature fluid supply path 44 is provided with a first end portion and a second end portion. The second end portion is branched into branch ends 44a, 44b, 44c, 44d and 44e. As shown in FIG. 7, the branch ends 44a, 44b, 44c, 44d and 44e are respectively connected to the valve units VU1, VU2, VU3, VU4 and VU5. Furthermore, the low-temperature fluid recovery path 45 is provided with a first end portion and a second end portion. The second end portion is branched into branch ends 45a, 45b, 45c, 45d and 45e. The branch ends 45a, 45b, 45c, 45d and 45e are respectively connected to the valve units VU1, VU2, VU3, VU4 and VU5.

The first heat exchange medium supply device 100a is a device which supplies a heat exchange medium (hereinafter often referred to as "low-temperature fluid") whose temperature is adjusted to a first temperature. For example, the first heat exchange medium supply device 100a is a cooler, which is configured to cool down the heat exchange medium recovered from the valve units VU1, VU2, VU3, VU4 and VU5 through the low-temperature fluid recovery path 45 to the first temperature and supply the heat exchange medium having the first temperature to the valve units VU1, VU2, VU3, VU4 and VU5 through the low-temperature fluid supply path 44. The first temperature is a temperature lower than a target temperature and may be set equal to, e.g., −30 degrees C.

Furthermore, the valve unit group VU is coupled to a supply port of the second heat exchange medium supply device 100b through a high-temperature fluid supply path 46 (see FIG. 1). Moreover, the valve unit group VU is coupled to a recovery port of the second heat exchange medium supply device 100b through a high-temperature fluid recovery path 47. The high-temperature fluid supply path 46 is provided with a first end portion and a second end portion. The second end portion is branched into branch ends 46a, 46b, 46c, 46d and 46e. As shown in FIG. 7, the branch ends

46*a*, 46*b*, 46*c*, 46*d* and 46*e* are respectively connected to the valve units VU1, VU2, VU3, VU4 and VU5. Furthermore, the high-temperature fluid recovery path 47 is provided with a first end portion and a second end portion. The second end portion is branched into branch ends 47*a*, 47*b*, 47*c*, 47*d* and 47*e*. The branch ends 47*a*, 47*b*, 47*c*, 47*d* and 47*e* are respectively connected to the valve units VU1, VU2, VU3, VU4 and VU5.

The second heat exchange medium supply device 100*b* is a device which supplies a heat exchange medium (hereinafter often referred to as "high-temperature fluid") whose temperature is adjusted to a second temperature higher than the first temperature. For example, the second heat exchange medium supply device 100*b* is a heater, which is configured to heat the heat exchange medium recovered from the valve units VU1, VU2, VU3, VU4 and VU5 through the high-temperature fluid recovery path 47 to the second temperature and supply the heat exchange medium having the second temperature to the valve units VU1, VU2, VU3, VU4 and VU5 through the high-temperature fluid supply path 46. The second temperature is a temperature lower than a target temperature and may be set equal to, e.g., 90 degrees C.

Next, a description will be made on the valve units VU1, VU2, VU3, VU4 and VU5 of the valve unit group VU. As shown in FIG. 7, the valve unit VU1 is coupled to the supply flow path 26*a* through a first pipe line 40*a*. Furthermore, the valve unit VU1 is coupled to the recovery flow path 28*a* through a second pipe line 42*a*. In one example, the first pipe line 40*a* and the second pipe line 42*a* can be connected to the supply flow path 26*a* and the recovery flow path 28*a* by being inserted into the supply pipe 12*a* and the recovery pipe 14*a* of the case 4, respectively. The valve unit VU1 has a function of permitting or inhibiting the supply of the heat exchange medium from the first heat exchange medium supply device 100*a* or the second heat exchange medium supply device 100*b* to the first pipes 22 arranged within the zone Z1. Furthermore, the valve unit VU1 has a function of selectively switching the low-temperature fluid supplied through the low-temperature fluid supply path 44 and the high-temperature fluid supplied through the high-temperature fluid supply path 46 to the heat exchange medium to be supplied to the first pipes 22 arranged within the zone Z1.

Just like the valve unit VU1, the valve units VU2, VU3, VU4 and VU5 are respectively coupled to the supply flow paths 26*b*, 26*c*, 26*d* and 26*e* through first pipe lines 40*b*, 40*c*, 40*d* and 40*e*. The first pipe lines 40*a* to 40*e* will be collectively referred to as "first pipe lines 40" as needed. Furthermore, the valve units VU2, VU3, VU4 and VU5 are respectively coupled to the recovery flow paths 28*b*, 28*c*, 28*d* and 28*e* through second pipe lines 42*b*, 42*c*, 42*d* and 42*e*. The second pipe lines 42*a* to 42*e* will be collectively referred to as "second pipe lines 42" as needed. The valve units VU2, VU3, VU4 and VU5 have functions of permitting or inhibiting the supply of the heat exchange medium from the first heat exchange medium supply device 100*a* or the second heat exchange medium supply device 100*b* to the first pipes 22 arranged within each of the zones Z2, Z3, Z4 and Z5, respectively. Furthermore, the valve units VU2, VU3, VU4 and VU5 have functions of selectively switching the low-temperature fluid supplied through the low-temperature fluid supply path 44 and the high-temperature fluid supplied through the high-temperature fluid supply path 46 to the heat exchange medium to be supplied to the first pipes 22 arranged within the zones Z2, Z3, Z4 and Z5, respectively.

Referring back to FIG. 1 again, an upper electrode 60 is installed within the processing vessel 52. The upper electrode 60 is disposed above the plate 2 serving as a lower electrode, while facing the plate 2. The plate 2 and the upper electrode 60 are installed in a substantially parallel relationship with each other. A processing space PS where, e.g., plasma etching, is performed on the substrate W, is defined between the upper electrode 60 and the plate 2.

The upper electrode 60 is supported on a top portion of the processing vessel 52 through an insulating shield member 62. The upper electrode 60 may include an electrode plate 64 and an electrode support body 66. The electrode plate 64 is disposed to face the processing space PS and includes a plurality of gas ejection holes 64*a* defined therein. The electrode plate 64 may be configured by a low-resistance conductor or semiconductor which is small in Joule heat. The electrode plate 64 is grounded.

The electrode support body 66 is configured to detachably support the electrode plate 64 and may be made of, e.g., a conductive material such as aluminum or the like. The electrode support body 66 may have a water-cooling structure. A gas diffusion chamber 66*a* is formed within the electrode support body 66. A plurality of gas flow holes 66*b* communicating with the respective gas ejection holes 64*a* extends downward from the gas diffusion chamber 66*a*. A gas introduction port 66*c* through which a process gas is introduced into the gas diffusion chamber 66*a* is formed in the electrode support body 66. The gas introduction port 66*c* is connected to a gas supply pipe 68.

The gas supply pipe 68 is coupled to a gas source 70 via a series of a valve 72 and a mass flow controller (MFC) 74. A flow control system (FCS) may be installed in place of the MFC 74. The gas source 70 is a source of the process gas. The process gas supplied from the gas source 70 is introduced into the gas diffusion chamber 66*a* through the gas supply pipe 68, and subsequently, is ejected into the processing space PS through the gas flow holes 66*b* and the gas ejection holes 64*a*.

The plasma processing apparatus 50 may further include a grounding conductor 52*a*. The grounding conductor 52*a* has a substantially cylindrical shape and is installed so as to extend upward beyond a height position of the upper electrode 60 from the sidewall of the processing vessel 52.

Furthermore, in the plasma processing apparatus 50, a deposit shield 76 is detachably installed along an inner wall of the processing vessel 52. The deposit shield 76 is also installed on an outer periphery of the stage ST. The deposit shield 76 serves to prevent an etching byproduct (or a deposit) from adhering to the processing vessel 52. The deposit shield 76 may be configured by coating an aluminum material with ceramics such as $Y_2O_3$ or the like.

At a bottom side of the processing vessel 52, an exhaust plate 78 is installed between the stage ST and the inner wall of the processing vessel 52. The exhaust plate 78 may be configured by, for example, coating an aluminum material with ceramics such as $Y_2O_3$ or the like. In the processing vessel 52, an exhaust port 52*e* is formed below the exhaust plate 78. The exhaust port 52*e* is coupled to an exhaust device 80 through an exhaust pipe 53. The exhaust device 80 is provided with a vacuum pump such as a turbo molecular pump or the like. The exhaust device 80 can depressurize the interior of the processing vessel 52 to a desired degree of vacuum. Furthermore, a carry-in/carry-out gate 52*g* through which the substrate W is transferred is installed in the sidewall of the processing vessel 52. The carry-in/carry-out gate 52*g* can be opened and closed by a gate valve 81.

In one embodiment, the plasma processing apparatus 50 further includes a high-frequency power supply HFG, a high-frequency power supply LFG, a matching unit MU1 and a matching unit MU2. The high-frequency power supply HFG is designed to generate a high-frequency power for the generation of plasma. The high-frequency power supply HFG is configured to supply the high-frequency power having a frequency of 27 MHz or higher, e.g., 40 MHz, to the plate 2 via the matching unit MU1. The matching unit MU1 is provided with a circuit which is configured to match an internal (or output) impedance of the high-frequency power supply HFG with a load impedance. The high-frequency power supply LFG is designed to generate a high-frequency bias power for the implantation of ions. The high-frequency power supply LFG is configured to supply high-frequency bias power having a frequency of 13.56 MHz or lower, e.g., 3 MHz, to the plate 2 via the matching unit MU2. The matching unit MU2 is provided with a circuit which is configured to match an internal (or output) impedance of the high-frequency power supply LFG with a load impedance. In some embodiments, the lower electrode may be installed independently of the plate 2.

In one embodiment, the plasma processing apparatus 50 may further include a control unit Cnt. The control unit Cnt is a computer which includes a processor, a memory unit, an input device, a display device, and so forth. The control unit Cnt is configured to control respective parts of the plasma processing apparatus 50, such as a power supply system, a gas supply system, a drive system and the like. Through the control unit Cnt, an operator can perform a command input manipulation or the like using the input device in order to manage the plasma processing apparatus 50. Furthermore, the operating situation of the plasma processing apparatus 50 can be visually displayed on the display device. Moreover, the memory unit of the control unit Cnt stores a control program for enabling the processor to control various kinds of processes implemented by the plasma processing apparatus 50, and a program, namely a process recipe, for causing the respective parts of the plasma processing apparatus 50 to implement respective processes pursuant to processing conditions.

Figure 8:
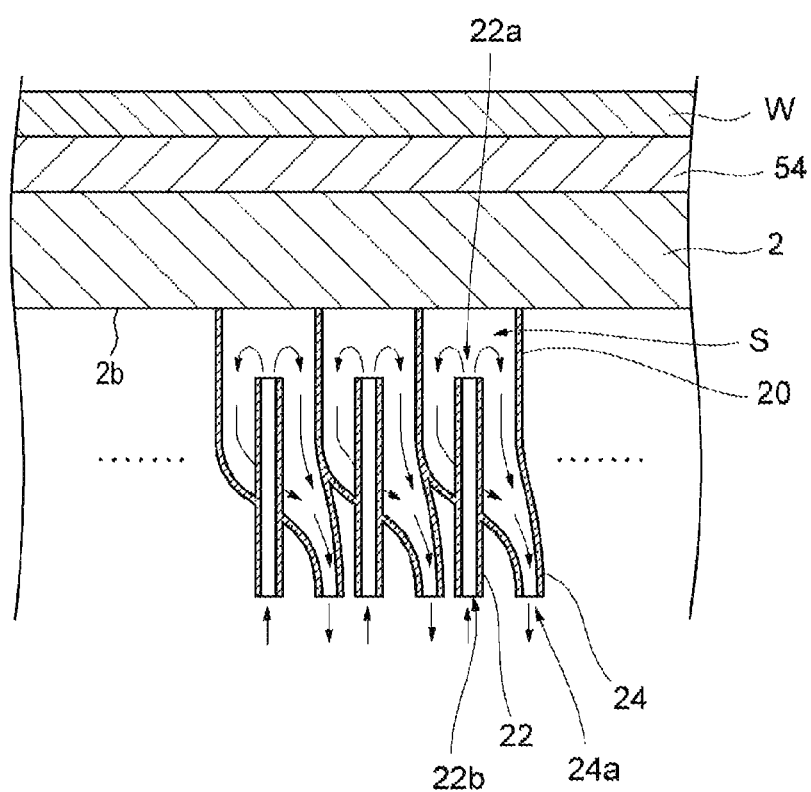
FIG. 8 is a sectional view schematically showing a flow of a heat exchange medium within a heat exchanger.

Next, a description will be made on the flow of the heat exchange medium within the stage ST. FIG. 8 is a sectional view schematically showing the flow of the heat exchange medium within the heat exchanger 6.

The heat exchange medium supplied from the first heat exchange medium supply device 100a or the second heat exchange medium supply device 100b into the stage ST through the first openings 16 passes through the supply flow paths 26 of the flow path part 8, followed by flowing into the first pipes 22 through the second opened ends 22b. The heat exchange medium introduced through the second opened ends 22b flows upward along the first pipes 22, followed by being discharged from the first opened ends 22a toward the rear surface 2b of the plate 2. The heat exchange medium discharged from the first opened ends 22a makes contact with the rear surface 2b of the plate 2 facing the first opened ends 22a, whereby heat exchange is performed between the heat exchange medium and the plate 2. The heat exchange medium subjected to the heat exchange moves downward along the partition wall 20, followed by being discharged through the openings 24a of the second pipes 24 to the outside of the spaces S. The heat exchange medium discharged from the spaces S is returned to the first heat exchange medium supply device 100a or the second heat exchange medium supply device 100b via the recovery flow paths 28 connected to the openings 24a and the second openings 18.

Figure 9:
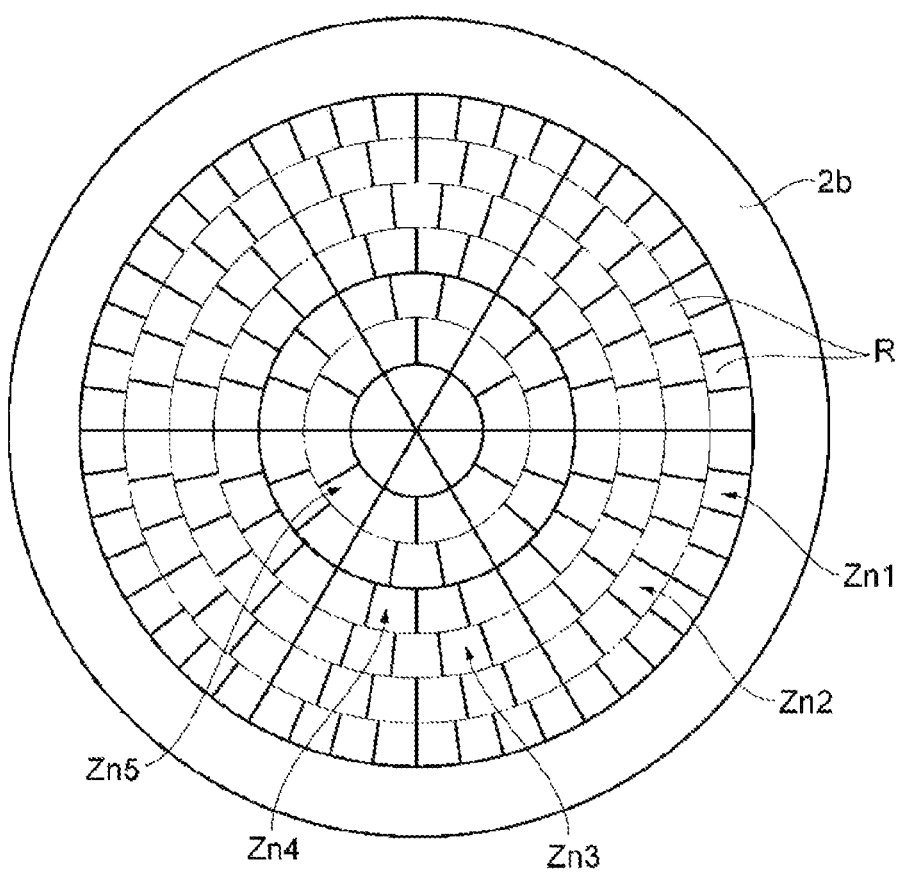
FIG. 9 is a plan view of a rear surface of a plate.

As described above, the heat exchanger 6 is configured such that the heat exchange medium is individually ejected from the first pipes 22 which are two-dimensionally arranged and extend in a mutually parallel relationship, followed by being recovered by the second pipes 24 through the respective spaces S. That is to say, the spaces S are two-dimensionally defined in the heat exchanger 6 such that they serve as heat exchange units which provide mutually-independent flow paths of the heat exchange medium. In the spaces S, the heat exchange medium is individually discharged from the first opened ends 22a facing the rear surface 2b of the plate 2. Thus, as shown in FIG. 9, the heat exchange medium is individually supplied to a plurality of regions R which is two-dimensionally arranged in the rear surface 2b of the plate 2. This suppresses a difference in the temperature of the heat exchange medium supplied from the first pipes 22 to the regions R from being generated. Furthermore, the heat exchange medium discharged from the first pipes 22 into the spaces S is supplied toward the plate 2 in a vertical direction (in a punctate pattern). Therefore, as compared with a case where the heat exchange medium is supplied toward the plate 2 in a horizontal direction (in a linear pattern), it is possible to uniformly supply the heat exchange medium with enhanced controllability within one unit to which the heat exchange medium is supplied.

Further, the valve units VU1, VU2, VU3, VU4 and VU5 are configured to control the supply or cutoff of the heat exchange medium flowing to the first pipes 22 for each of the zones Z1, Z2, Z3, Z4 and Z5. With these valve units VU1, VU2, VU3, VU4 and VU5, it is possible to independently control the supply or cutoff of the heat exchange medium flowing to a plurality of zones Zn1, Zn2, Zn3, Zn4 and Zn5 distributed in the rear surface 2b of the plate 2 (see FIG. 9). Thus, according to the system configured as above, it is possible to accurately control a temperature of the rear surface 2b of the plate 2. As an example, even when plasma generated above the substrate W is in a non-uniform state by intentionally making the temperatures of the zones Zn1, Zn2, Zn3, Zn4 and Zn5 non-uniform, it is possible to realize an in-plane uniformity of processing. The zones Zn1, Zn2, Zn3, Zn4 and Zn5 of the plate 2 are regions which face the zones Z1, Z2, Z3, Z4 and Z5 of the heat exchanger 6 and which are bounded by a plurality of concentric circles, respectively. That is to say, it can be said that the first pipes 22 arranged within the respective zones Z1, Z2, Z3, Z4 and Z5 are the first pipes 22 facing the zones Zn1, Zn2, Zn3, Zn4 and Zn5 of the plate 2. In some embodiments, temperature measuring units for measuring temperatures of the respective zones may be installed in the plate 2.

Figure 10:
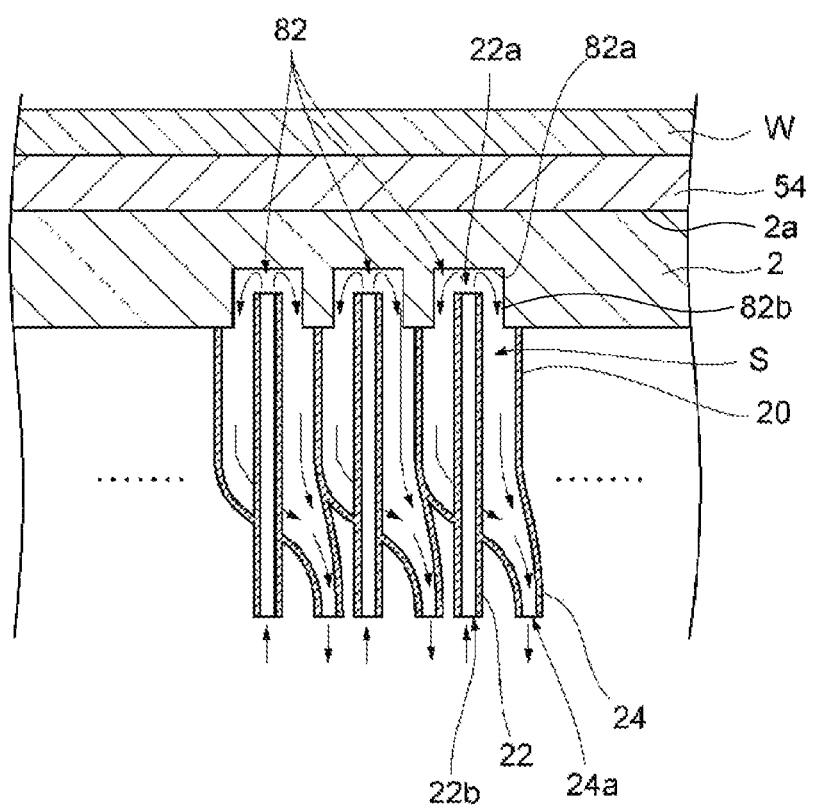
FIG. 10 is a sectional view schematically showing a flow of a heat exchange medium within a heat exchanger.

In another alternate embodiment, as shown in FIG. 10, a plurality of recess portions 82 may be formed in the rear surface 2b of the plate 2. Each of the recess portions 82 is formed to extend toward the front surface 2a of the plate 2 so that the extended space S is defined. The first opened ends 22a may be respectively inserted into the recess portions 82. Each of the recess portions 82 includes a top wall 82a which is defined as an upper side of the recess portion and a sidewall surface 82b which is defined as a lateral side of the recess portion 82. A horizontal cross-sectional shape of each of the recess portions 82 may be an arbitrary polygonal shape or a circular shape, or may be identical with the shape of each of the cell parts C. In the embodiment shown in FIG. 10, the top wall 82a and the sidewall surface 82b of each of the recess portions 82 become surfaces which make contact with the heat exchange medium, thus increasing an area where the heat exchange is performed. In addition, a position where the heat exchange is performed can be brought near the front surface 2a close to a heat generation source. Accordingly, this embodiment improves the heat exchange efficiency.

Figure 11:
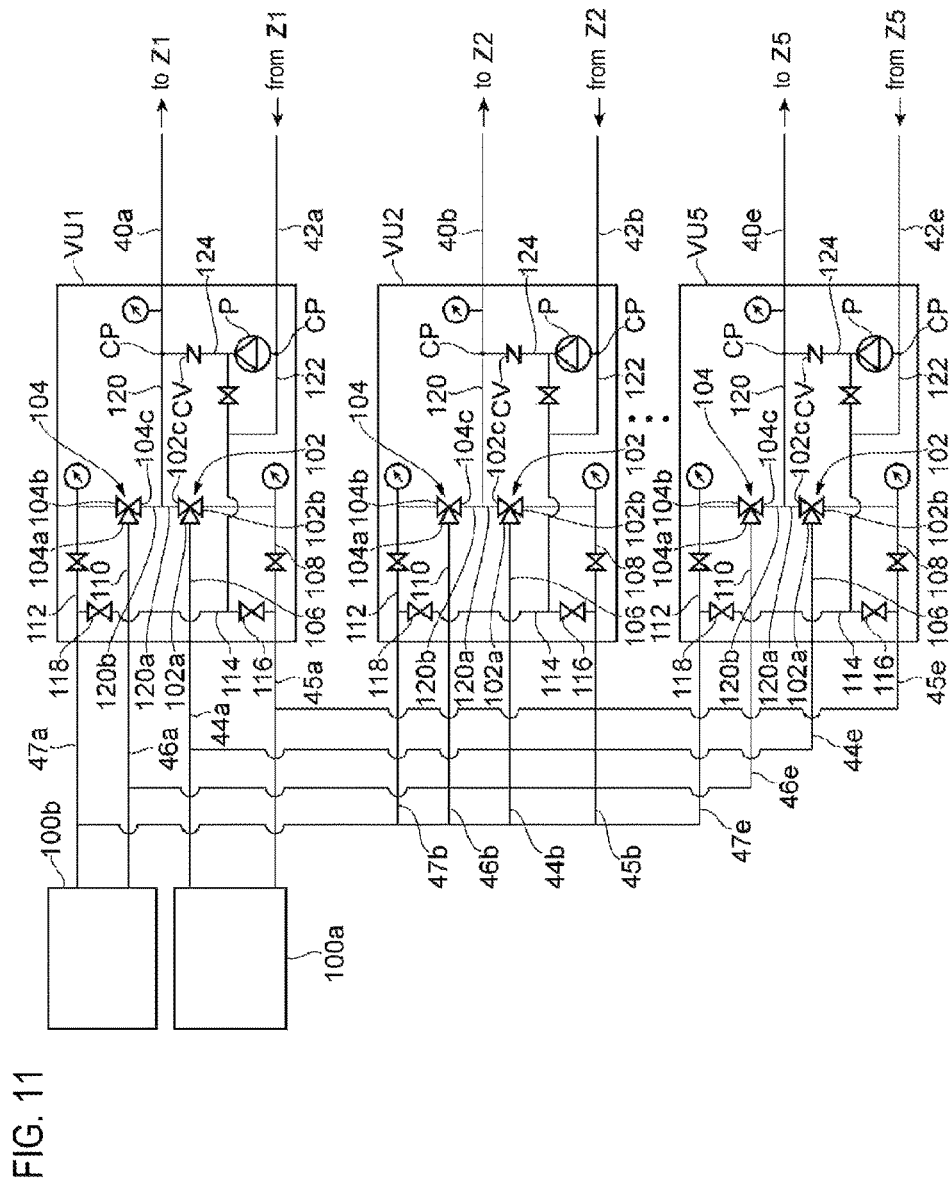
FIG. 11 is a view schematically showing an internal configuration of a valve unit group.

Next, the valve units VU1, VU2, VU3, VU4 and VU5 will be described in detail with reference to FIG. 11. As shown in FIG. 11, the valve units VU1, VU2, VU3, VU4 and VU5 are identical in configuration with one another. Therefore, the following description will be primarily focused on only the valve unit VU1. The valve unit VU1 is disposed between the first heat exchange medium supply device 100a and the second heat exchange medium supply device 100b and the heat exchanger 6.

The valve unit VU1 includes a first valve 102 and a second valve 104. The first valve 102 is a three-way valve which includes a first port 102a, a second port 102b and a third port 102c. The second valve 104 is a three-way valve which includes a first port 104a, a second port 104b and a third port 104c. The first valve 102 and the second valve 104 are configured such that they can be opened and closed independently of each other.

The first port 102a of the first valve 102 is connected to one end of a first supply line 106 (a first heat exchange medium supply line). The other end of the first supply line 106 is connected to the supply port of the first heat exchange medium supply device 100a through the branch end 44a of the low-temperature fluid supply path 44. The second port 102b of the first valve 102 is connected to one end of a first recovery line 108. The other end of the first recovery line 108 is connected to the recovery port of the first heat exchange medium supply device 100a through the branch end 45a of the low-temperature fluid recovery path 45.

The first port 104a of the second valve 104 is connected to one end of a second supply line 110 (a second heat exchange medium supply line). The other end of the second supply line 110 is connected to the supply port of the second heat exchange medium supply device 100b through the branch end 46a of the high-temperature fluid supply path 46. The second port 104b of the second valve 104 is connected to one end of a second recovery line 112. The other end of the second recovery line 112 is connected to the recovery port of the second heat exchange medium supply device 100b through the branch end 47a of the high-temperature fluid recovery path 47.

A first bypass line 114 parallel-connected to the second recovery line 112 is connected to the intermediate position of the first recovery line 108. A third valve 116 and a fourth valve 118 are serially connected to the first bypass line 114. The third valve 116 and the fourth valve 118 are two-way valves whose opening and closing can be controlled independently of each other.

The third port 102c of the first valve 102 and the third port 104c of the second valve 104 are connected to one end of a common line 120 via a first line 120a and a second line 120b, respectively. The first line 120a is connected to the third port 102c of the first valve 102. The second line 120b is connected to the third port 104c of the second valve 104. The other end of the common line 120 is connected to the first pipes 22 arranged within the zone Z1 of the heat exchanger 6, via the first pipe line 40a and the supply flow path 26a.

A return line 122 is located in the valve unit VU1, one end of which is connected to the second pipe line 42a and the other end of which is connected to the first bypass line 114 at a position existing between the third valve 116 and the fourth valve 118. Both ends of a second bypass line 124 are respectively connected to connection points CP located at an intermediate position of the return line 122 and at an intermediate position of the common line 120. A pump P and a check valve CV are installed in the second bypass line 124.

The valve units VU2, VU3, VU4 and VU5 are identical in configuration with the valve unit VU1. One end of the common lines 120 of the valve units VU2, VU3, VU4 and VU5 are respectively connected to the first pipes 22 arranged within the zones Z2, Z3, Z4 and Z5, via the supply flow paths 26b, 26c, 26d and 26e, respectively. Furthermore, the first valve 102 and the second valve 104 of each of the valve units VU2, VU3, VU4 and VU5 are configured such that the opening and closing thereof can be controlled independently of each other.

Next, a description will be made on flow routes of the heat exchange medium. The system according to one embodiment can switch the flow state of the heat exchange medium to a first flow state, a second flow state or a third flow state by controlling the opening and closing of various kinds of valves within the valve unit group VU based on a control signal transmitted from the control unit Cnt. In the first flow state, a low-temperature fluid is supplied to the respective zones of the heat exchanger 6. In the second flow state, a high-temperature fluid is supplied to the respective zones of the heat exchanger 6. In the third flow state, the supply of the low-temperature fluid and the high-temperature fluid to the heat exchanger 6 is cut off.

First Flow State

First, a description will be made on the first flow state. In the case of the first flow state, the first valve 102 is controlled such that the connection between the first port 102a and the second port 102b is cut off while the connection between the first port 102a and the third port 102c is permitted. The second valve 104 is controlled such that the connection between the first port 104a and the second port 104b is permitted while the connection between the first port 104a and the third port 104c is cut off. Furthermore, the third valve 116 is opened and the fourth valve 118 is closed.

In the first flow state, the low-temperature fluid flowing inward from the first heat exchange medium supply device 100a through the branch end 44a of the low-temperature fluid supply path 44 flows through the first supply line 106, the first line 120a and the common line 120, and subsequently, is supplied to the first pipes 22 arranged within the zone Z1, through the first pipe line 40a and the supply flow paths 26a. The heat exchange medium recovered from the second pipes 24 arranged within the zone Z1 flows into the valve unit VU1 through the recovery flow path 28a and the second pipe line 42a. A part of the heat exchange medium flowing into the valve unit VU1 is moved through the return line 122, the third valve 116 in the first bypass line 114 and the first recovery line 108 and subsequently, is returned to the first heat exchange medium supply device 100a through the branch end 45a of the low-temperature fluid recovery path 45. The remaining part of the heat exchange medium flowing into the valve unit VU1 is moved through the return line 122, the second bypass line 124 and the common line 120 and subsequently, is supplied to the first pipes 22 arranged in the zone Z1, via the first pipe line 40a and the supply flow path 26a.

On the other hand, the high-temperature fluid flowing inward from the second heat exchange medium supply device 100b through the branch end 46a of the high-temperature fluid supply path 46 is moved through the second supply line 110 and the second recovery line 112 and is returned to the second heat exchange medium supply device 100b without flowing into the common line 120. As mentioned above, in the first flow state, the low-temperature fluid is supplied to the first pipes 22 arranged within the zone Z1 of the heat exchanger 6. The supply of the high-temperature fluid to the first pipes 22 arranged within the zone Z1 of the heat exchanger 6 is cut off.

Second Flow State

Next, a description will be made on the second flow state. In case of the second flow state, the first valve 102 is controlled such that the connection between the first port 102*a* and the second port 102*b* is permitted while the connection between the first port 102*a* and the third port 102*c* is cut off. The second valve 104 is controlled such that the connection between the first port 104*a* and the second port 104*b* is cut off while the connection between the first port 104*a* and the third port 104*c* is permitted. Furthermore, the third valve 116 is closed and the fourth valve 118 is opened.

In the second flow state, the low-temperature fluid flowing inward from the first heat exchange medium supply device 100*a* through the branch end 44*a* of the low-temperature fluid supply path 44 is moved through the first supply line 106 and the first recovery line 108 and subsequently, is returned to the first heat exchange medium supply device 100*a* without flowing into the common line 120.

On the other hand, the high-temperature fluid flowing inward from the second heat exchange medium supply device 100*b* through the branch end 46*a* of the high-temperature fluid supply path 46 is moved through the second supply line 110, the second line 120*b* and the common line 120 and subsequently, is supplied into the first pipes 22 arranged within the zone Z1, via the first pipe line 40*a* and the supply flow path 26*a*. The heat exchange medium recovered from the second pipes 24 arranged within the zone Z1 is introduced into the valve unit VU1 through the recovery flow path 28*a* and the second pipe line 42*a*. A part of the heat exchange medium introduced into the valve unit VU1 is moved through the return line 122, the fourth valve 118 in the first bypass line 114 and the second recovery line 112 and subsequently, is returned to the second heat exchange medium supply device 100*b* through the branch end 47*a* of the high-temperature fluid recovery path 47. The remaining part of the heat exchange medium introduced into the valve unit VU1 is moved through the return line 122, the second bypass line 124 and the common line 120 and subsequently, is supplied to the first pipes 22 arranged within the zone Z1, via the first pipe line 40*a* and the supply flow path 26*a*. As mentioned above, in the second flow state, the high-temperature fluid is supplied to the first pipes 22 arranged within the zone Z1 of the heat exchanger 6. The supply of the low-temperature fluid to the first pipes 22 is cut off.

Third Flow State

Next, a description will be made on the third flow state. In the case of the third flow state, the first valve 102 is controlled such that the connection between the first port 102*a* and the second port 102*b* is permitted while the connection between the first port 102*a* and the third port 102*c* is cut off. The second valve 104 is controlled such that the connection between the first port 104*a* and the second port 104*b* is permitted while the connection between the first port 104*a* and the third port 104*c* is cut off. Furthermore, the third valve 116 and the fourth valve 118 are closed.

In the third flow state, the low-temperature fluid flowing inward from the first heat exchange medium supply device 100*a* through the branch end 44*a* of the low-temperature fluid supply path 44 is moved through the first supply line 106 and the first recovery line 108 and subsequently, is returned to the first heat exchange medium supply device 100*a* without flowing into the common line 120. The high-temperature fluid flowing inward from the second heat exchange medium supply device 100*b* through the branch end 46*a* of the high-temperature fluid supply path 46 is moved through the second supply line 110 and the second recovery line 112 and subsequently, is returned to the second heat exchange medium supply device 100*b* without flowing into the common line 120. That is to say, in the third flow state, the supply of both the low-temperature fluid and the high-temperature fluid to the heat exchanger 6 is cut off.

When coming into the first flow state or the second flow state in the past, the heat exchange medium remains within the heat exchanger 6. This heat exchange medium is circulated through the flow paths by the operation of the pump P installed in the second bypass line 124. More specifically, the heat exchange medium existing within the heat exchanger 6 is introduced into the valve unit VU1 through the recovery flow path 28*a* and the second pipe line 42*a*. Subsequently, the heat exchange medium flows through the return line 122, the second bypass line 124 and the common line 120, followed by being supplied to the first pipes 22 arranged within the zone Z1, via the first pipe line 40*a* and the supply flow paths 26*a*. With this third flow state, the supply of the heat exchange medium from the first heat exchange medium supply device 100*a* and the second heat exchange medium supply device 100*b* to the first pipes 22 arranged within the zone Z1 of the heat exchanger 6 is cut off.

As described above, the valve unit VU1 is configured such that the low-temperature fluid and the high-temperature fluid can be supplied to a plurality of regions without mixing them with each other by independently controlling the opening and closing of the respective ports of the valve unit VU1. That is to say, with the valve unit VU1, the heat exchange medium to be supplied to the first pipes 22 arranged within the zone Z1 can be instantly switched to the low-temperature fluid or the high-temperature fluid. Particularly, the control unit Cnt controls the first valve 102 and the second valve 104 such that the third port 104*c* of the second valve 104 is closed if the third port 102*c* of the first valve 102 remains opened and such that the third port 102*c* of the first valve 102 is closed if the third port 104*c* of the second valve 104 remains opened. Accordingly, it is possible to rapidly change the temperature of the heat exchange medium supplied from the first pipes 22 arranged within the zone Z1 to the zone Zn1 of the plate 2. This improves the responsive control for the temperature of the plate 2. Furthermore, even in the case of the valve units VU2, VU3, VU4 and VU5, it is possible to individually switch the flow state of the heat exchange medium to the first flow state, the second flow state or the third flow state. In this embodiment, the low-temperature fluid and the high-temperature fluid are kept at specific temperatures. In addition, the fluid flowing into the common line 120 is one of the low-temperature fluid, the high-temperature fluid and the circulating fluid. Thus, the temperature control according to this embodiment is not the control of the fluid temperature but is performed by adjusting the in-plane temperature of the plate 2 through the control of the valve unit group VU. In other words, the temperature control is performed depending on the supply amounts of the fluids having three temperatures and the zones to which the fluids are to be supplied. With this configuration, the temperature control can be performed more rapidly than when the temperature control is performed using a change in temperature of the heat exchange medium per se. In some embodiments, values measured by thermometers installed corresponding to a plurality of zones within the plate 2 may be used in the temperature control.

Figure 12:
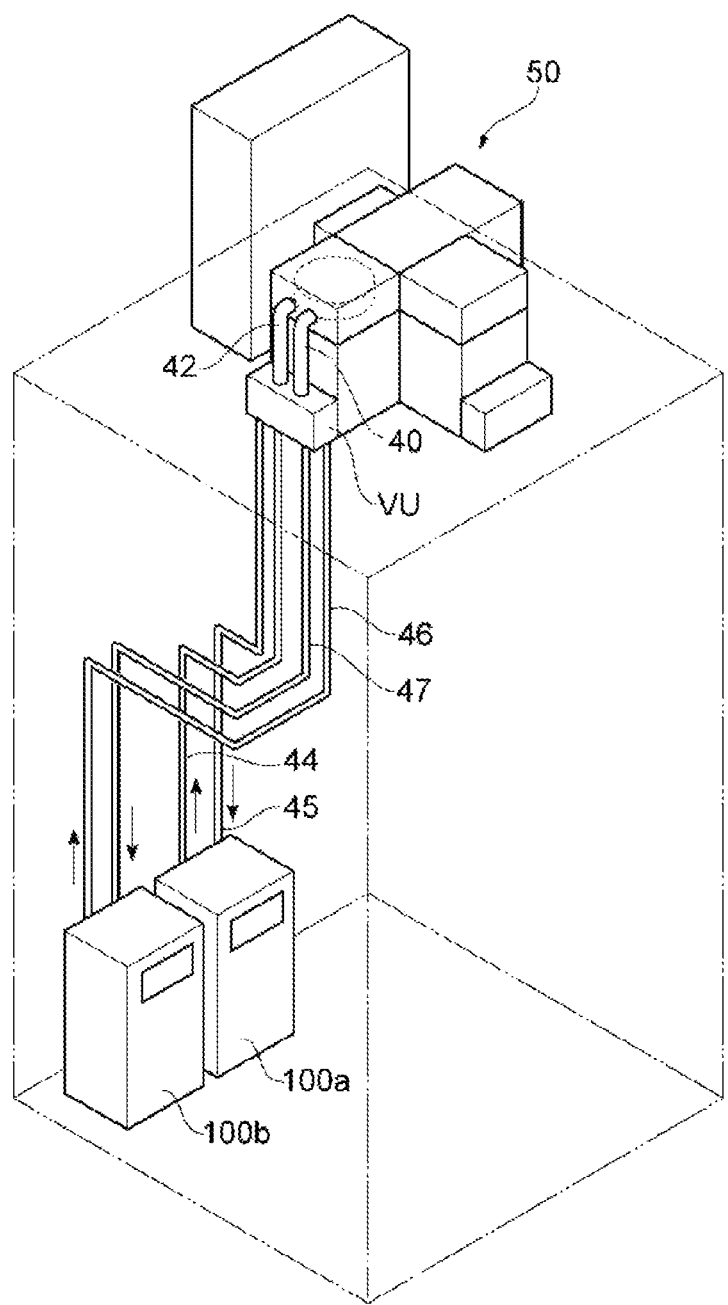
FIG. 12 is a perspective view schematically showing a semiconductor manufacturing equipment which includes a plasma processing apparatus according to another embodiment.

FIG. 12 is a perspective view schematically showing a semiconductor manufacturing equipment which includes the plasma processing apparatus 50 configured as above. In general, heat exchange medium supply devices are not disposed on a floor having a limited space, on which the plasma processing apparatus 50 is disposed, but are disposed on another floor. In the semiconductor manufacturing equipment shown in FIG. 12, the first heat exchange medium supply device 100a and the second heat exchange medium supply device 100b are disposed on a floor differing from the floor on which the plasma processing apparatus 50 is disposed. However, the valve unit group VU is disposed on the same floor as the floor on which the plasma processing apparatus 50 is disposed. With this configuration, the heat exchange medium to be supplied to the heat exchanger 6 can be switched near the plasma processing apparatus 50. It is therefore possible to perform the temperature control with high responsiveness. In this case, it is preferred in some embodiments that a distance from the valve unit group VU to the supply flow paths 26 and the recovery flow paths 28, namely a length of the flow path interconnecting each of the valve units VU1 to VU5 and the heat exchanger 6, is set equal to or shorter than 2 m.

Next, a description will be made on a stage temperature control method according to another embodiment, which employs the system described above. In the following description, it is assumed that the rear surface 2b of the plate 2 is divided into n zones including first to nth zones and each of the n zones is divided into m regions (where n and m are integers of 2 or more and where n is smaller than m). It is also assumed that the system includes, as the valve unit group VU, n valve units including first to nth valve units. It is further assumed that the first to nth valve units control the supply of the heat exchange medium to the first to nth zones.

Figure 13:
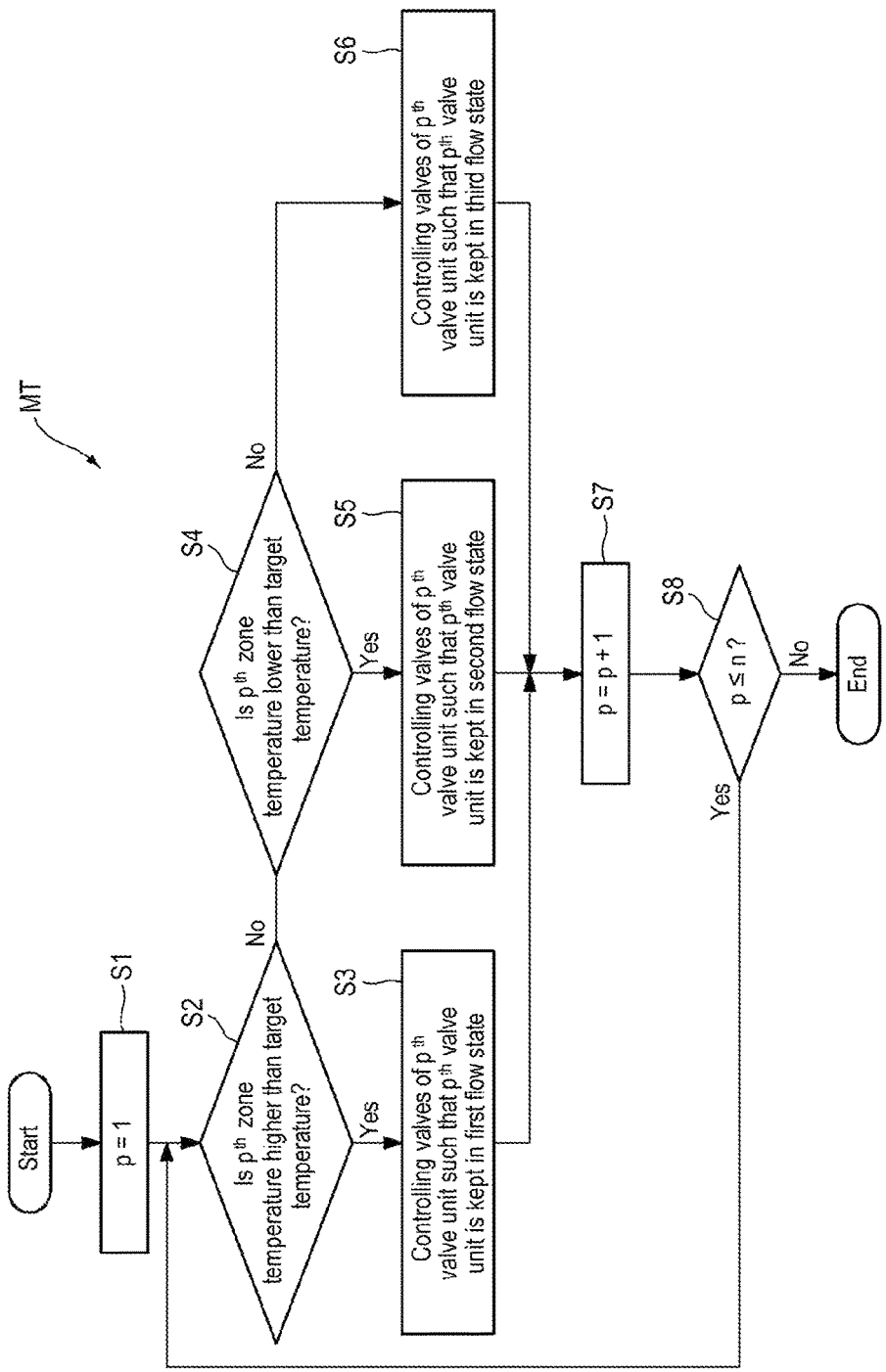
FIG. 13 is flowchart showing a temperature control method according to another embodiment.

FIG. 13 is a flowchart showing a stage temperature control method MT according to another embodiment. The stage temperature control method MT is implemented by, for example, controlling the valve units VU1 to VU5 with the control unit Cnt. In this method MT, step S1 is first performed. At step S1, a parameter p is initialized to 1. Subsequently, at step S2, determination is made as to whether a temperature of the $p^{th}$ zone is higher than a target temperature. If it is determined that the temperature of the $p^{th}$ zone is higher than the target temperature, the control process goes to step S3. At step S3, the valves of the $p^{th}$ valve unit are controlled such that the $p^{th}$ valve unit is kept in the first flow state. That is to say, the low-temperature fluid is circulated between the first heat exchange medium supply device 100a and the $p^{th}$ zone. By performing step S3, the temperature of the $p^{th}$ zone of the plate 2 is reduced.

If it is determined at step S2 that the temperature of the $p^{th}$ zone is equal to or lower than the target temperature, the control process goes to step S4. At step S4, determination is made as to whether the temperature of the $p^{th}$ zone is lower than the target temperature. If it is determined that the temperature of the $p^{th}$ zone is lower than the target temperature, the control process goes to step S5. At step S5, the valves of the $p^{th}$ valve unit are controlled such that the $p^{th}$ valve unit is kept in the second flow state. That is to say, the high-temperature fluid is circulated between the second heat exchange medium supply device 100b and the $p^{th}$ zone. By performing step S5, the temperature of the $p^{th}$ zone of the plate 2 is increased.

If it is determined at step S4 that the temperature of the $p^{th}$ zone is equal to or higher than the target temperature, namely that the temperature of the $p^{th}$ zone is the target temperature, the control process goes step S6. At step S6, the valves of the $p^{th}$ valve unit are controlled such that the $p^{th}$ valve unit is kept in the third flow state. That is to say, the heat exchange medium circulating through the common line 120 of the $p^{th}$ valve unit is not returned to the first heat exchange medium supply device 100a and the second heat exchange medium supply device 100b but is allowed to circulate between the $p^{th}$ zone and the pump P (a first pump or a second pump) of the $p^{th}$ valve unit.

Upon completion of step S3, S5 or S6, the control process goes to step S7. At step S7, the parameter p is incremented by one. Subsequently, at step S8, determination is made as to whether the parameter p is equal to or smaller than the total number n of the zones. If the parameter p is equal to or smaller than the total number n of the zones, step S3, S5 or S6 is repeatedly performed until the parameter p becomes larger than the total number n of the zones. If the parameter p becomes larger than the total number n of the zones, the control process is ended. Steps S1 to S8 may be repeatedly performed at a predetermined time interval.

As described above, in the method MT, the temperature control is performed with respect to each of the zones of the plate 2. That is to say, by performing a series of operations including: circulating the low-temperature fluid between the first heat exchange medium supply device 100a and the $p^{th}$ zone; circulating the high-temperature fluid between the second heat exchange medium supply device 100b and the $p^{th}$ zone; and circulating the heat exchange medium between the $p^{th}$ zone and the pump P of the $p^{th}$ valve unit without returning the heat exchange medium to the first heat exchange medium supply device 100a and the second heat exchange medium supply device 100b, the $p^{th}$ zone is controlled such that the temperature of the $p^{th}$ zone becomes equal to the target temperature. In some embodiments, the series of operations may be performed in an arbitrary order.

While some embodiments of the present disclosure have been described above, the present disclosure is not limited to the aforementioned embodiments but may be modified in many different forms. As an example, the cell part C defined by the partition wall 20 is not limited to a rectangular columnar shape but may have a circular columnar shape or a substantially polygonal shape.

While in the above embodiments, the heat exchanger 6 and the flow path part 8 has been described to be installed independently of each other, the present disclosure is not limited thereto. As an example, the heat exchanger 6 and the flow path part 8 may be integrated with each other. In the aforementioned embodiments, the heat exchanger 6 has been described to be accommodated within the case 4 but may be installed above the case 4. In this case, the heat exchanger 6 is made of metal.

Furthermore, the processing apparatus which makes use of the stage ST is not limited to the plasma processing apparatus. The stage ST may be used in an arbitrary processing apparatus as long as the processing apparatus is designed to process a substrate while controlling the temperature of the substrate. As an example, the stage ST may be suitably used in a semiconductor manufacturing equipment such as a coating/developing apparatus, a cleaning apparatus, a film forming apparatus, an etching apparatus, an ashing apparatus, a heat treatment apparatus or the like and in a flat panel display manufacturing apparatus.

While the above embodiments have been described with a focus on the uniform control of the temperature distribution of the substrate, the present disclosure is not limited thereto. As an example, a non-uniform plasma distribution may be eliminated by intentionally making the temperature distribution of the substrate non-uniform. In this case, the non-uniform substrate temperature distribution can be realized by adjusting the conductance of the flow paths or by independently supplying the heat exchange medium to the individual flow paths. This makes it possible to process the substrate with enhanced in-plane uniformity. In some embodiments, a heater may be installed within the plasma processing apparatus. The arrangement and shape of the heater may be adjusted and a temperature of the heater may be controlled. In the aforementioned embodiments, the heater (heating element) for heating the stage may not be installed. That is to say, the stage of this embodiment is capable of rapidly controlling the temperature. For that reason, even if the heat exchange medium (mainly, the cooling medium) and the heater are not used in combination, it is possible to appropriately control the temperature of a wafer. In particular, if a plurality of heaters is arranged on a zone-by-zone basis, the probability of the heaters failing due to the disconnection thereof goes higher. In this embodiment, the temperature control can be performed without having to use a heater. It is therefore possible to stably operate the apparatus.

Figure 14:
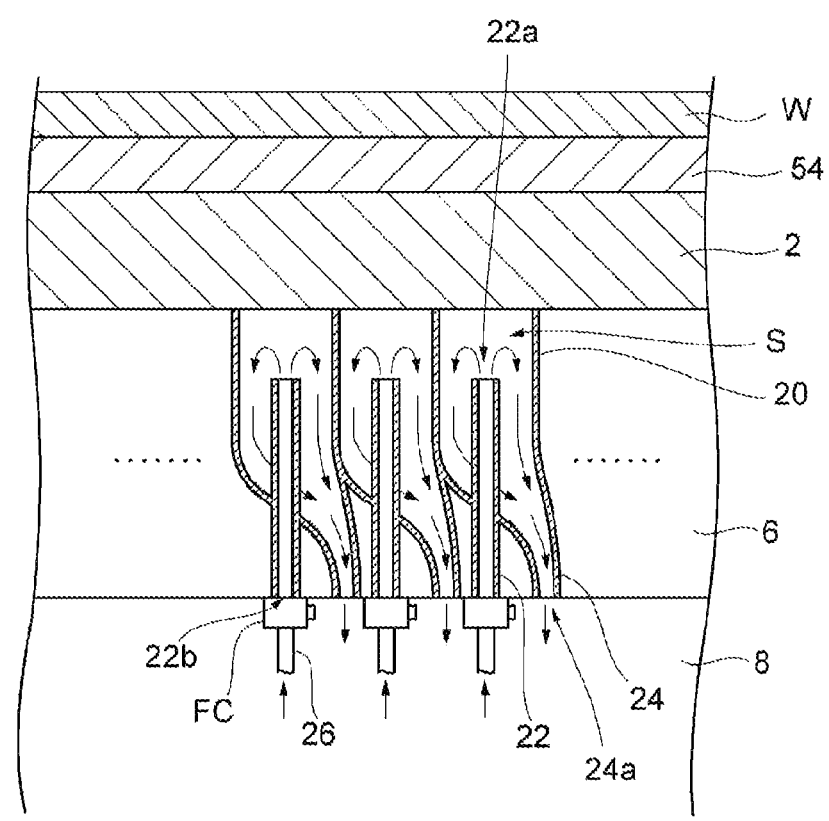
FIG. 14 is a sectional view schematically showing the flow of a heat exchange medium within a heat exchanger.

In some embodiments, as shown in FIG. 14, a plurality of flow rate controllers FC may be installed between one of the ends of the supply flow paths 26 and the first pipes 22. The flow rate controllers FC are, e.g., needle valves or orifices, and are configured to control the flow rate of the heat exchange medium flowing into the first pipes 22. Alternatively, the flow rate controllers FC may be installed between the first pipe lines 40*a*, 40*b*, 40*c*, 40*d* and 40*e* and the supply flow paths 26*a*, 26*b*, 26*c*, 26*d* and 26*e*. In this case, the flow rate controllers FC can control the flow rates of the heat exchange medium flowing into the first pipes 22, on a zone-by-zone basis.

Figure 15:
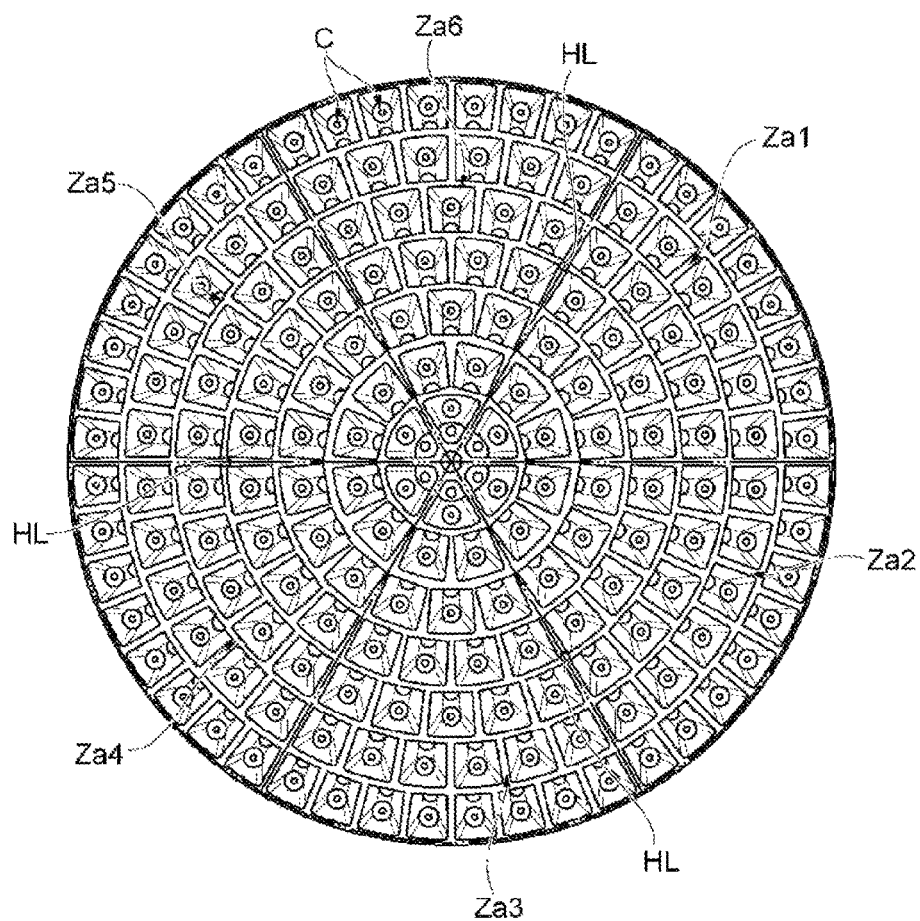
FIGS. 15 and 16 are plan views of a heat exchanger according to modified examples.
Figure 16:
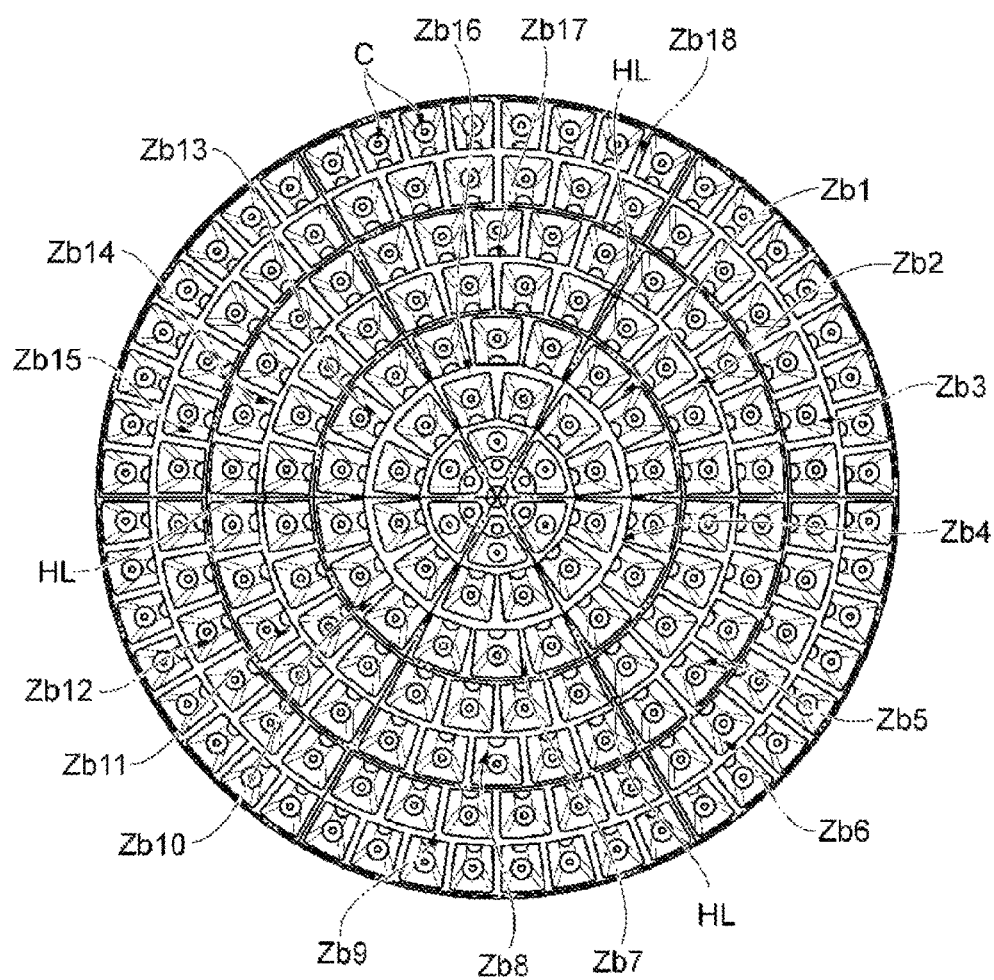

While in the above embodiments, the heat exchanger 6 has been described to be divided into the zones Z1, Z2, Z3, Z4 and Z5 bounded by the plurality of concentric circles, the shape of the zones is not limited thereto. As an example, as shown in FIG. 15, the heat exchanger 6 may be divided into a plurality of zones along the circumferential direction. In the examples shown in FIG. 15, the heat exchanger 6 is divided into six zones Za1 to Za6 along a circumferential direction. However, the number of zones to be divided can be arbitrarily set. Moreover, as shown in FIG. 16, the heat exchanger 6 may be divided into a plurality of zones along both the circumferential direction and a radial direction. In the example shown in FIG. 16, the heat exchanger 6 is divided into eighteen zones Zb1 to Zb18 along the circumferential direction and the radial direction. However, the number of zones to be divided can be arbitrarily set. In these cases, the supply or cutoff of the heat exchange medium supplied to the rear surface 2*b* of the plate 2 can be controlled for each of the zones divided along the circumferential direction or along both the circumferential and radial directions.

The heat exchanger is not limited to one having the illustrated configuration but may have an arbitrary configuration as long as the configuration can individually supply a heat exchange medium to a plurality of regions obtained by circumferentially dividing each of the zones which is bounded by a plurality of concentric circles centered at the central axis of the plate 2 and can individually recover the heat exchange medium thus supplied.

The first valve 102 and the second valve 104 are not limited to the three-way valves. In some embodiments, the first valve 102 and the second valve 104 may be arbitrary valves as long as they can individually control the flow of the heat exchange medium from the first supply line 106 or the second supply line 110 toward the common line 120. In addition, the aforementioned embodiments may be combined unless a conflict arises.

According to different aspects and embodiments of the present disclosure, there is provided a system capable of accurately controlling a temperature of a mounting stand.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A system including a temperature-controllable stage, comprising:

a disc-shaped plate having a front surface on which a substrate is mounted and a rear surface;

a heat exchanger configured to individually supply a heat exchange medium to a plurality of regions two-dimensionally arranged to face the rear surface of the disc-shaped plate and configured to individually recover the heat exchange medium supplied to the regions, the plurality of regions in the heat exchanger being obtained by dividing a plurality of zones defined to face the rear surface of the disc-shaped plate;

a plurality of valve units configured to supply or cutoff, for each of the plurality of zones, the heat exchange medium to the plurality of regions;

a cooler configured to cool down the heat exchange medium recovered from the heat exchanger via the plurality of valve units and supply the cooled-down heat exchange medium to the heat exchanger via the plurality of valve units;

a heater configured to heat the heat exchange medium recovered from the heat exchanger via the plurality of valve units and supply the heated heat exchange medium to the heat exchanger via the plurality of valve units; and a controller that performs a control to allow the plurality of valve units to individually switch a flow state of the heat exchange medium to one of a first flow state in which the heat exchange medium is supplied from the cooler to the heat exchanger, a second flow state in which the heat exchange medium is supplied from the heater to the heat exchanger, and a third flow state in which supply of the heat exchange medium from the cooler and the heater to the heat exchanger is cut off and the heat exchange medium remaining in the heat exchanger circulates between the plurality of valve units and the heat exchanger, wherein the heat exchanger includes:

a plurality of first pipes two-dimensionally arranged below the disc-shaped plate, the first pipes extending upward toward the rear surface of the disc-shaped plate and having opened ends respectively facing the regions;

a plurality of partition walls configured to define a plurality of spaces respectively surrounding the first pipes; and a plurality of second pipes connected to the plurality of partition walls so as to respectively communicate with the respective spaces, wherein the plurality of spaces is defined by the plurality of partition walls so as to have the heat exchange medium, which is ejected from the respective opened ends of the plurality of first pipes toward the rear surface of the disc-shaped plate, individually recovered into corresponding ones of the plurality of spaces respectively surrounding the plurality of first pipes, wherein each of the valve units includes:

a common line having a first end connected to the first pipes that provides the opened ends in the same zone, and a second end;

a first line and a second line which are connected to the second end of the common line;

a first heat exchange medium supply line connected to the cooler;

a second heat exchange medium supply line connected to the heater;

a first recovery line connected to the cooler;

a second recovery line connected to the heater;

a first valve which is a three-way valve having a first port connected to the first heat exchange medium supply line, a second port connected to the first recovery line, and a third port connected to the first line;

a second valve which is a three-way valve having a first port connected to the second heat exchange medium supply line, a second port connected to the second recovery line, and a third port connected to the second line;

a first bypass line having a first end connected to the first recovery line via a third valve, and a second end connected to the second recovery line via a fourth valve;

a return line having a first end connected to the second pipes that communicate with the spaces in the same zone, and a second end connected to the first bypass line at a position between the third valve and the fourth valve; and a second bypass line having a first end connected to a point in a middle of the return line, and a second end connected to a point in a middle of the common line, and wherein the first valve and the second valve are capable of being opened and closed independently of each other, and the third valve and the fourth valve are capable of being opened and closed independently of each other.

2. The system of claim 1, wherein the cooler is configured to supply the heat exchange medium adjusted to a first temperature, and the heater is configured to supply the heat exchange medium adjusted to a second temperature higher than the first temperature.

3. The system of claim 2, wherein each of the valve units is configured to supply the heat exchange medium adjusted to the first temperature and the heat exchange medium adjusted to the second temperature, to the regions without mixing the heat exchange medium adjusted to the first temperature and the heat exchange medium adjusted to the second temperature.

4. The system of claim 1, wherein each of the valve units is configured such that, if the first valve remains opened, the second valve is closed and such that, if the second valve remains opened, the first valve is closed.

5. The system of claim 1, wherein the plurality of zones is bounded by a plurality of concentric circles defined to face the rear surface of the disc-shaped plate, and the plurality of regions is obtained by dividing the plurality of zones along a circumferential direction of the disc-shaped plate.

6. The system of claim 1, wherein the heat exchanger is configured to supply the heat exchange medium perpendicularly to the rear surface of the disc-shaped plate.

7. The system of claim 1, wherein the heat exchanger is mainly composed of resin.

8. The system of claim 7, wherein the opened ends of the plurality of first pipes are made of carbon-containing resin.

9. The system of claim 1, wherein a plurality of recess portions into which the opened ends of the plurality of first pipes are respectively inserted is formed in the rear surface of the disc-shaped plate.

10. The system of claim 1, wherein a flow path interconnecting each of the valve units and the heat exchanger has a length of 2 m or less.

11. The system of claim 1, wherein the number of the plurality of valve units is n, the number of the plurality of zones is n, the number of the plurality of regions is m, and n is smaller than m (where n and m are integers of 2 or more).

12. A semiconductor manufacturing equipment provided with the system of claim 1.

13. The system of claim 1, wherein in the first flow state, the controller performs a control to:

cut off a connection between the first port of the first valve and the second port of the first valve and permit a connection between the first port of the first valve and the third port of the first valve;

cut off a connection between the first port of the second valve and the third port of the second valve and permit a connection between the first port of the second valve and the second port of the second valve;

open the third valve; and close the fourth valve.

14. The system of claim 1, wherein in the second flow state, the controller performs a control to:

cut off a connection between the first port of the first valve and the third port of the first valve and permit a connection between the first port of the first valve and the second port of the first valve;

cut off a connection between the first port of the second valve and the second port of the second valve and permit a connection between the first port of the second valve and the third port of the second valve;

close the third valve; and open the fourth valve.

15. The system of claim 1, wherein in the third flow state, the controller performs a control to:

cut off a connection between the first port of the first valve and the third port of the first valve and permit a connection between the first port of the first valve and the second port of the first valve;

cut off a connection between the first port of the second valve and the third port of the second valve and permit a connection between the first port of the second valve and the second port of the second valve;
close the third valve; and
close the fourth valve.

\* \* \* \* \*

UNITED STATES PATENT AND TRADEMARK OFFICE
CERTIFICATE OF CORRECTION

PATENT NO. : 10,502,508 B2
APPLICATION NO. : 14/751179
DATED : December 10, 2019
INVENTOR(S) : Tsutomu Hiroki It is certified that error appears in the above-identified patent and that said Letters Patent is hereby corrected as shown below:

On the Title Page

Item (72) please remove the Inventor City "Nirakaki" and replace with "Nirasaki"

Signed and Sealed this
Twenty-fifth Day of February, 2020

Andrei Iancu
*Director of the United States Patent and Trademark Office*